(12) United States Patent
Fujita et al.

(10) Patent No.: US 7,795,865 B2
(45) Date of Patent: Sep. 14, 2010

(54) METHOD OF FORECASTING AND DETECTING POLISHING ENDPOINT AND THE DEVICE THEREOF AND REAL TIME FILM THICKNESS MONITORING METHOD AND THE DEVICE THEREOF

(75) Inventors: Takashi Fujita, Mitaka (JP); Toshiyuki Yokoyama, Mitaka (JP); Keita Kitade, Mitaka (JP)

(73) Assignee: Tokyo Seimitsu Co., Ltd., Tokyo (JP)

( * ) Notice: Subject to any disclaimer, the term of this patent is extended or adjusted under 35 U.S.C. 154(b) by 334 days.

(21) Appl. No.: 11/975,195

(22) Filed: Oct. 18, 2007

(65) Prior Publication Data

US 2008/0290865 A1 Nov. 27, 2008

(30) Foreign Application Priority Data

May 21, 2007 (JP) .............................. 2007-134707

(51) Int. Cl.
*G01B 7/06* (2006.01)
*B24B 49/04* (2006.01)
*B24B 49/10* (2006.01)
*G01R 33/12* (2006.01)

(52) U.S. Cl. ............................ 324/229; 324/239; 451/8

(58) Field of Classification Search ................. 324/222, 324/226, 228, 229, 230, 239; 438/11, 13, 438/14, 17, 18, 692; 451/5, 6, 7, 8, 9, 10, 451/41; 427/9, 10

See application file for complete search history.

(56) References Cited

U.S. PATENT DOCUMENTS

| 5,559,428 | A | 9/1996 | Li et al. ...................... 324/71.5 |
| 5,949,293 | A | 9/1999 | Akamatsu et al. ............. 331/65 |
| 7,046,001 | B2 | 5/2006 | Tada et al. ................... 324/230 |
| 2002/0047705 | A1* | 4/2002 | Tada et al. ................... 324/230 |
| 2006/0214657 | A1 | 9/2006 | Tada et al. ................... 324/230 |
| 2009/0058409 | A1* | 3/2009 | Fujita .......................... 324/230 |
| 2009/0061733 | A1* | 3/2009 | Fujita et al. ..................... 451/5 |
| 2009/0256558 | A1* | 10/2009 | Fujita et al. ................. 324/230 |

FOREIGN PATENT DOCUMENTS

| JP | 2003-021501 | 1/2003 |
| JP | 2003-106805 | 4/2003 |

* cited by examiner

*Primary Examiner*—Kenneth J Whittington
(74) *Attorney, Agent, or Firm*—Fattibene and Fattibene; Paul A. Fattibene

(57) ABSTRACT

A method and device for forecasting and detecting a polishing endpoint and real time film thickness monitoring capable of suppressing to a minimum Joule heat loss due to an eddy current, and precisely forecasting and detecting the polishing endpoint, and precisely calculating a remaining film amount to be removed and a polishing rate. A high frequency inductor sensor is positioned close to the conductive film, and monitors a flux change induced in the conductive film. When a film thickness becomes a film thickness corresponding to a skin depth of the conductive film a method of calculating on the spot a polishing rate and a remaining film amount to be removed is provided.

12 Claims, 12 Drawing Sheets

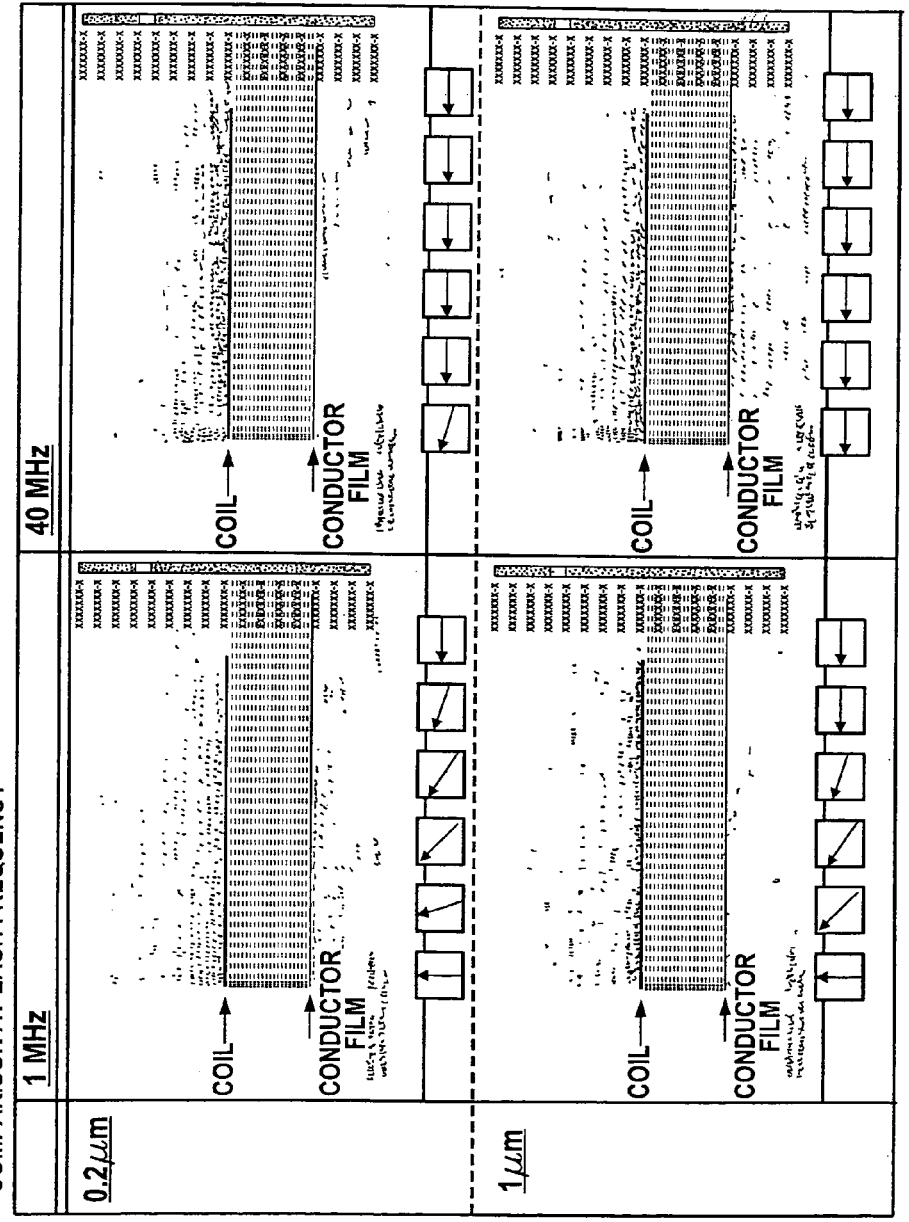

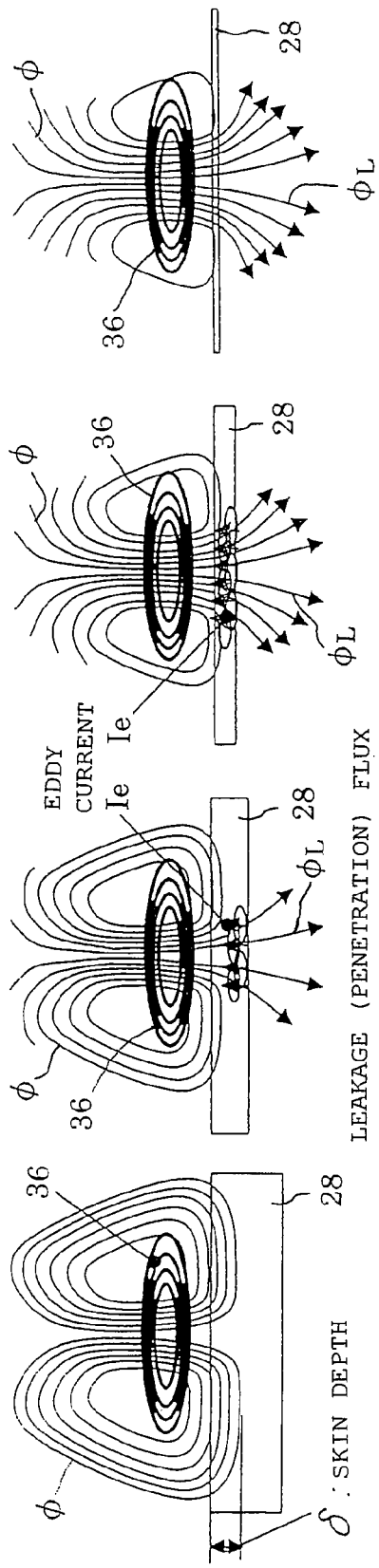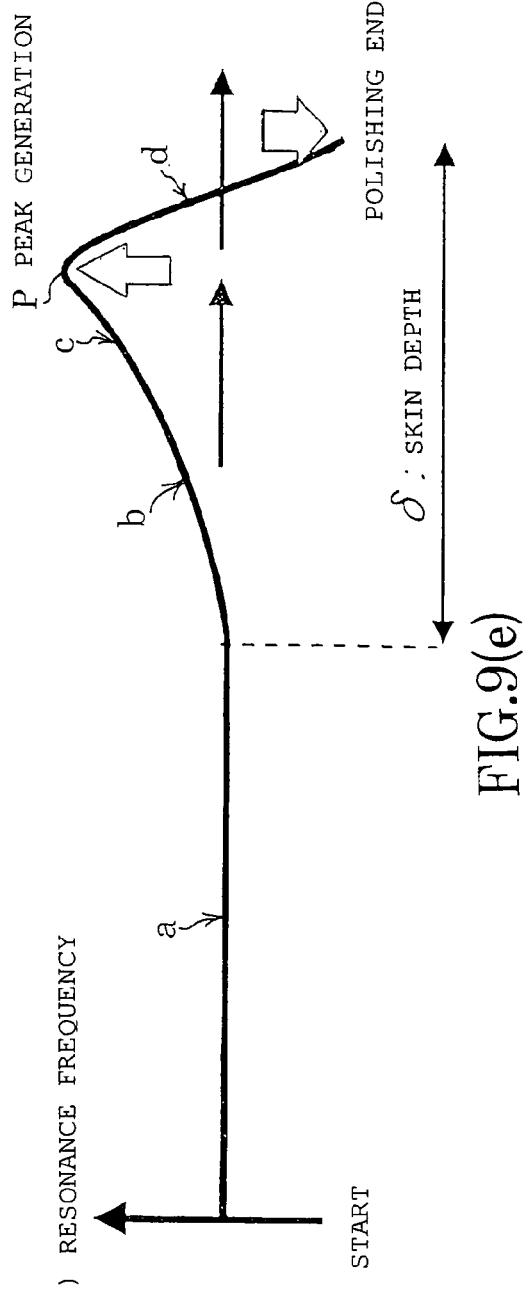

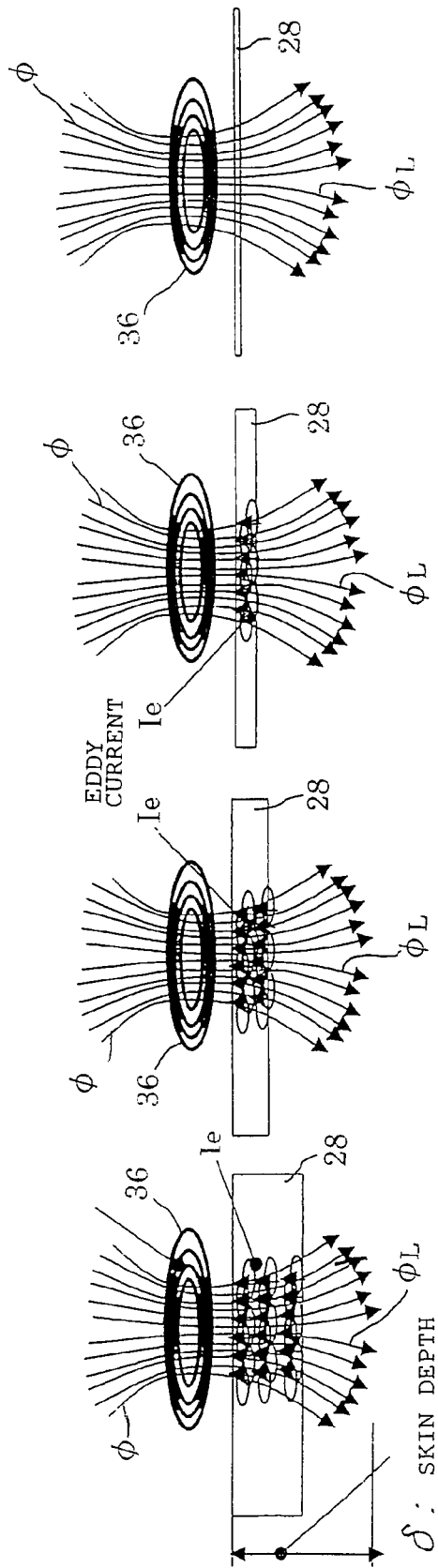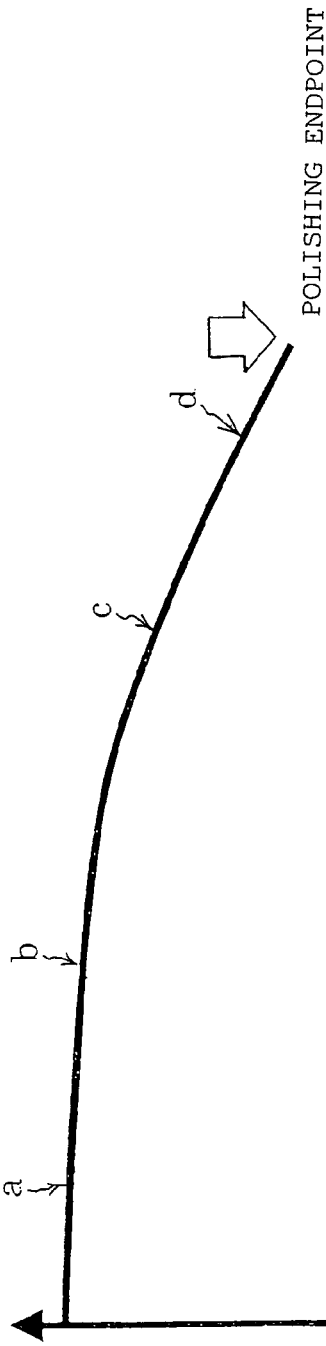

METHOD OF FORECASTING AND DETECTING POLISHING ENDPOINT AND THE DEVICE THEREOF AND REAL TIME FILM THICKNESS MONITORING METHOD AND THE DEVICE THEREOF

FIELD OF THE INVENTION

The present invention relates to a method of forecasting and detecting a polishing endpoint and the device thereof, and a real time film thickness monitoring method and the device thereof, and in particular, it relates to a method of forecasting and detecting the polishing endpoint and the device thereof and a real time film thickness monitoring method and the device thereof, in which a joule heat loss due to an eddy current in a chemical mechanical polishing (CMP) and the like is suppressed to the minimum, and after that, the polishing endpoint can be precisely forecast and detected, and moreover, whether a predetermined conductive film is appropriately removed can be accurately evaluated in real time.

BACKGROUND OF THE INVENTION

There is known a process in which, for example, an oxide film is formed on the surface of a semiconductor wafer, and this oxide film is subjected to a lithography and an etching so as to form a groove pattern corresponding to a wiring pattern, and on this groove pattern, a conductive film comprising Cu and the like to fill the groove pattern is deposited, and from this conductive film, an unnecessary portion except for the filled portion such as a groove pattern and a through hole is removed by the chemical mechanical polishing, thereby forming a wiring pattern. In this formation of the wring pattern, it is extremely important to accurately detect the polishing endpoint when the unnecessary portion of the conductive film is removed at an appropriate thickness to stop the process. When the polishing of the conductive film is excessive, a resistance of the wiring increases, and when the polishing is insufficient, an insulation fault of the wiring is caused.

As the prior art relating to this, for example, there is known the following monitoring method of a change of the film thickness on the spot. This prior art is a method of monitoring a change of the thickness of the conductive film on the spot in the method of removing an conductive film from above a substrate main body (semiconductor wafer) by the chemical mechanical polishing, and arranges in the vicinity of the conductive film a series or a parallel resonance circuit with an inductor and a condenser comprising a coil wound around a ferrite-pot type core to form and shape so as to bring about a directional characteristic in an electromagnetic field, and applies a sweep output comprising 20 Hz to 40.1 MHz from an excitation signal source to the sensor through an operating point setting impedance means. As a result, when the sensor is excited, an oscillating current flows into the coil, thereby generating an alternating electromagnetic field. The alternating electromagnetic field subsequently induces an eddy current into the conductive film. When the eddy current is induced into the conductive film, two effects arise. In the first place, the conductive film acts as a loss resistance, and its effect is a resistance load to a sensor circuit, and the effect reduces the amplitude of a resonance signal, and reduces a resonance frequency. In the second place, when the thickness of the conductive film is reduced, an effect arises as though a metal rod were pulled out from the coil of the inductor. As a result, a change of an inductance and a shift of the frequency are created. In this manner, by monitoring a change of the frequency shift relating to the sensor resonance peak caused by a change of the thickness of the conductive film, a change of the thickness of the conductive film is continuously detected (for example, Patent Document 1).

Further, as another prior art, there is known, for example, the following eddy current sensor. This prior art comprises a sensor coil (eddy current sensor) arranged in the vicinity of the conductive film or a base substance formed with the conductive film, an alternating current signal source supplying to the sensor coil an alternating current signal of a constant frequency at approximately 8 to 32 MHz and forming the eddy current in the conductive film, and a detection circuit measuring a reactance component and a resistance component including the conductive film, and the sensor coil comprises an oscillating coil connected to the signal source, a detection coil arranged in the conductive film side of the coil, and a balance coil arranged in an opposite side to the conductive film of the oscillating coil, and the detection coil and the balance coil are connected so as to be mutually put into a reverse phase. From the resistance component and the reactance component detected in the detection circuit, a synthesized impedance is outputted, and from a change of the impedance, a change of the film thickness of the conductive film is detected as an approximately linear relationship in a wide range (for example, see Patent Document 2).

Further, as another prior art, there is known, for example, the following eddy current sensor. In this prior art also, similarly to the above mentioned prior art, in the paragraph [0008], the flux forming the sensor coil penetrates the conductive film on the substrate arranged in the whole surface of the sensor coil and alternately changes, thereby generate the eddy current in the conductive film, and the eddy current flows into the conductive film to cause an eddy current loss and leads to reduce the reactance component of the impedance of the sensor coil when viewed in terms of an equivalent circuit. Further, in the paragraph [0009], it is described that when the conductive film becomes gradually thin accompanied with the progress of the polishing by observing the change of the oscillation frequency of an oscillation circuit, the oscillation frequency is reduced to become a self-oscillation frequency of a tank circuit in which the conductive film is totally removed, and after that, the oscillation frequency becomes approximately constant, and therefore, by detecting this point, a finish point by the chemical mechanical polishing of the conductive film can be detected. Further, in the paragraph [0025], as shown in FIG. 2, in proportion to the progress of the polishing of the conductive film, the eddy current changes, and an equivalent resistance value of the sensor coil changes. Consequently, the oscillation frequency of the oscillating circuit changes and the oscillating signal is divided by a frequency divider circuit or subtracted by a subtracter, so that a signal corresponding to the magnitude of the frequency of the detected width is displayed in the monitor. As a result, a transition of the frequency locus as shown in FIG. 2 can be obtained (for example, see Patent Document 3).

[Patent Document 1] Japanese Patent Publication No. 2878178 (pp 2 to 7, FIG. 1 to 15)

[Patent Document 2] Japanese Patent Publication No. 3587822 (p. 3, FIG. 1 to 11)

[Patent Document 3] Japanese Patent Publication Laid-Open No. 2003-21501

In the prior art according to Patent Document 1, the sensor is provided with an inductor comprising a coil wound around a ferrite-pot type core to bring about directional characteristics in an electromagnetic field and a series or a parallel resonance circuit with a capacitor. The sensor is applied with a sweep output comprising the frequency range of 20 Hz to 40.1 MHz in the initial stage of the polishing, and by the alternating electromagnetic field having the directionality generated from the coil, a leakage flux penetrating the conductive film is generated, so that a large eddy current corresponding to the film thickness of the conductive film is induced from the initial stage of the polishing. To induce a large eddy current corresponding to the film thickness of the conductive film, a large alternating electromagnetic field, that is, the formation of a large flux to the extent of penetrating the conductive film is required, and the monitoring of a change of the thickness of the conductive film is performed by using the eddy current induced inside the conductive film from the initial stage to the final stage of the polishing. Therefore, during the monitoring of the change of the film thickness, it is necessary to allow the flux to penetrate in the direction to a thickness of the conductive film. This is apparent even from the fact that, in the drawing of the unexamined publication according to Patent Document 1, the lines of the flux penetrating the conductive film are drawn in all the portions of the conductive film.

In general, on the surface of the wafer at the initial stage of the polishing, immaculate Cu films (conductive films) are on the top layer. To induce the eddy current in all of these immaculate Cu films, an extremely large leakage flux is required. However, though the leakage flux induces the eddy current, any of these eddy currents turns into the joule heat in the form of the eddy current loss, and is consumed. This joule heat loss causes a relatively small heat generation due to a small volume resistance for the immaculate Cu film of the top surface, whereas, in the already wired inner portion, since a wired cross-sectional area is small and the volume resistance is small, a large eddy current is induced by the penetrating flux, and as a result, a large joule heat loss is locally produced. This, in some cases, is developed into a problem of partially molten and cut wiring, and results in a state of a so-called induction heating, particularly causing a phenomenon where the heat is confined inside. In particular, in the Cu wiring and the like, when Cu is heated, Cu is sometimes dispersed into a barrier film such as Ta, and depending on the circumstances, there is a fear that Cu is dispersed by bursting through the barrier film.

Further, when a wiring is applied on the surface portion of the wafer in several layers, there is not only concern over the Cu film on the surface layer, but also concern over the local heating and diffusion around of the inner wiring portion, which has already finished with the processing, and further diffusion of dopants forming a P type and a n type inside a semiconductor substrate so as to change the characteristics of the substrate inner element. Further, even if the heat is not generated, when an excessive eddy current flows into microscopic wirings, there is sometimes the case where electromigration is induced so as to cause a breaking of the wirings.

Further, for example, when the processing is performed by changing the polishing conditions at the time of having reached a predetermined remaining film amount in the vicinity of the polishing endpoint, it is difficult to find whether it is the predetermined remaining film amount. This is because, although it is possible to evaluate from the changed portion of the initial film thickness, when the initial film thickness fluctuates, the evaluation of the predetermined remaining film amount also fluctuates. Regarding the determination of the polishing endpoint, when a gap between the sensor and the conductive film minutely changes by a vibration of the polishing, a whole floating capacitance of the sensor circuit system changes, so that the whole resonance frequency shifts. As a result, supposing that a threshold value is set when the resonance frequency becomes a certain set resonance frequency and the setting of determining the polishing endpoint is made, when the resonance frequency totally shifts, the determination of the polishing endpoint by the setting of the threshold value becomes difficult. In this manner, in the conventional method, in the resonance frequency which changes by monotonously and continuously increasing or decreasing, even if the threshold value is set to a certain value, a gap between the sensor and the conductive film minutely changes or some sort of dielectric material intervenes between thereof, so that there exists often the case where its waveform itself totally and vertically parallel-displaces, and as a result, the threshold value set in advance often does not make any sense.

In the prior art according to Patent Document 2 using the eddy current sensor also, a monitoring of a change of the film thickness of the conductive film is conducted by observing a change of the eddy current from the initial stage of the polishing to the final stage of the polishing, and this is approximately the same as the prior art according to Patent Document 1.

Further, in the prior art which monitors the film thickness of the conductive film by using the eddy current from the initial stage of the polishing to the final stage of the polishing, it is necessary to fabricate a flux strong enough to the extent of permeating inside the film so as to induce an eddy current inside the film, and a shape of the inductor is three dimensional to allow the flux to have an directivity. Therefore, when the sensor is incorporated into the polishing apparatus and the like, generally, there is the following problem. The current flowing into the coil becomes large so that the power consumption becomes large, and a power unit also becomes large in size. The flux leaks circumferentially so as to easily generate a noise. The process of winding a conductive wire in a coil shape is required, which invites a high cost.

In the prior art comprising the eddy current sensor according to Patent Document 3, first, the hardware of the sensor portion used in this prior art is configured on condition that, first, the sensor coil penetrates the conductive film. Consequently, in the hardware generating the magnetic field only to the extent of not penetrating the conductive film, the eddy current is not formed and its purpose is not achieved. Further, the conductive film is reduced by the polishing, so that the area in which the eddy current is formed is monotonically decreased, and as a result, a behavior of monotonically decreasing the oscillation frequency is disclosed, and the time when its oscillation frequency becomes approximately constant is taken as a finish point of time, and the portion is detected. That is, in the algorism of the software used in this prior art, the change of the oscillation frequency takes a change which becomes approximately constant from the decrease as a change of the oscillation frequency, and for example, when this oscillation frequency changes so as to have a flexion point, it is hardly any detectable algorism. Further, as shown in FIG. 2, from the initial stage of the polishing, the flux penetrates the conductive film, and is always in a state of generating the eddy current. Here, the eddy current sensor always positively generates the eddy current, and a method of re-calculating into the film thickness change from the eddy current change is substituted by the eddy current sensor.

Consequently, a strong flux is not exercised up to a minute wiring formed inside the film, and as a result, the generation of the eddy current induced by electromagnetic induction is suppressed, and the Joule heat loss due to the eddy current is minutely suppressed, and at the same time, the situation is eliminated, in which an eddy current amount induced by the change of the gap between the sensor and the conductive film and interpositioning of dielectric materials such as slurry is totally shifted so that the setting of the threshold value is changed to a large extent and difficult to be detected is not occur, and even when the magnetic field is a minute magnetic field to the extent of not penetrating the device wafer, the magnetic field can be sufficiently and precisely detected, and the polishing endpoint is precisely forecast and detected, and further, the remaining film amount to be removed and a polishing rate and the like are precisely calculated on the spot, and to accurately evaluate whether the predetermined conductive film is appropriately removed, the technical problems to be solved are generated, and an object of the present invention is to solve these problems.

SUMMARY OF THE INVENTION

The present invention has been proposed to achieve the above described object, and the invention is a method of forecasting and detecting a polishing endpoint by forecasting and detecting the polishing endpoint when a predetermined conductive film is appropriately removed by polishing the conductive film, wherein an inductor in a high frequency inductor type sensor is brought close to the predetermined conductive film, and a flux change induced in the predetermined conductive film by the flux formed by the inductor is monitored, and a film thickness reference point is detected based on the flux change by a skin effect in which the film thickness during the polishing is decided with the material of the predetermined conductive film as a factor, and a method of forecasting and detection the polishing endpoint to forecast the polishing endpoint from the film thickness reference point is provided.

According to the configuration, the inductor is driven by the high frequency, and a flux which changes by corresponding to the cycle of the frequency from the inductor is generated. Until the predetermined conductive film reaches a film thickness corresponding to the skin depth by the polishing, the fluxes induced in the predetermined conductive film pass through the skin depth area along the film surface approximately in parallel. When the polishing progresses and the predetermined conductive film becomes equivalent to the skin depth or the film thickness in its vicinity, a leakage flux which penetrates the predetermined conductive film begins to be generated. By the change of the flux, the eddy current amount induced in the predetermined conductive film by electromagnetic induction changes. Since the eddy current has the leakage flux penetrating the film increased as the film thickness decreases, the eddy current induced gradually increases. By the eddy current generated in this wide area, a large mutual inductance is generated inside the predetermined conductive film. The mutual inductance operates such that a self-inductance of a sensor circuit system in the high frequency inductor type sensor is decreased. In this manner, at the initial stage, even when the conductive film thickness decreases, when the flux put into the conductive film thickness is such an extent of not penetrating the wafer, a constant eddy current is formed. After that, when the film thickness further decreases and becomes below a film thickness corresponding to the skin depth, the flux is generated, in which a part of the flux penetrates the conductive film on the wafer and leaks up to the backside of the wafer. At this time, together with the increase of the leakage flux, the eddy current induced inside the film becomes large. Next, the eddy current formed on the wafer surface up to a constant film thickness increases, but after that, in proportion as the conductive film is further removed, the conductive film itself generating the eddy current decreases, and therefore, the eddy current decreases. As a result, despite of a monotonic film thickness decreasing process, the eddy current increases once together with the increase of the penetrating flux, and after that, accompanied with further decrease of the film thickness, the eddy current rapidly decreases accompanied with the decrease of the volume itself which generates the eddy current, therefore, a maximum point appears in the mutual inductance corresponding to the induced eddy current. By this rapid decrease of the eddy current, the mutual inductance also rapidly decreases, whereas the inductance of the sensor circuit system turns to increase. In this manner, after the predetermined conductive film becomes equivalent to the skin depth or the film thickness in its vicinity by the progress of the polishing, the eddy current is generated and by the subsequent rapid decrease, the inductance of the sensor circuit system decreases once, and after that, turns to increase. By this behavior, a peak (flexion point) is generated in the waveform of the resonance frequency oscillated from the high frequency impedance type sensor. Based on this peak, a film thickness reference point short of the polishing endpoint is detected, and the polishing endpoint is forecast from the film thickness reference point.

This peak appears in the form of the film thickness corresponding to the skin depth, and thus, there is no such problem that the setting of the threshold value fluctuates by the total shift of the induced eddy current amount as described above, and the peak appears at the position corresponding to the remaining film thickness constantly. Particularly, when the conductive film is, for example, Cu, the peak appears in the vicinity of 710 Å of the remaining film of Cu. Further, in the case of a W film, the peak appears in a slightly thicker portion 2500 Å of the remaining film of W. Although the film thickness is different from the actual skin depth, it is a numerical value corresponding to the skin depth. While the skin depth $\delta$ is an index conveniently showing a depth in which the strength of the electromagnetic wave becomes 1/e in magnitude, the peak position is decided by electric conductivity, magnetic permeability, frequency to be applied, and the like, and therefore, is originated from the skin effect. The present invention is a technique achieved by dexterously using a unique phenomenon emerged from the skin effect of the material. In particular, the wiring material has high electric conductivity in the CMP of the wiring material, and this makes the peak position to appear as a sharp peak (maximum point) in the vicinity of the endpoint relatively (710 Å). Thereby, the peak point does not sway by various disturbances, and a robust endpoint detection and forecasting are made possible.

Further, the inductor type sensor does not intentionally and positively generate the eddy current inside the film, thereby monitoring the film thickness. In the conventionally known sensor, though the sensor is formed so as to have the directivity, thereby giving the magnetic field to penetrate the conductive film, in the inductor type sensor according to the present invention, a planar inductor is used. As a result, an inductor is provided, whose object is not that the magnetic field is given the directivity, but that the conductive film is allowed to appropriately diffuse the magnetic field so as not to deeply infiltrate the conductive film. This is because, when the magnetic field deeply infiltrates or a strong magnetic field is given to deeply infiltrate the magnetic field, there are often the cases where the inner wiring is locally heated by the eddy current or the wiring itself is broken by electromigration and the like. Therefore, the inductor is configured to be a planar inductor which forms an adequate flux distribution to the extent of not allowing the magnetic field to infiltrate the conductive film as much as possible, in order word, not generating an eddy current to give damages to the element. Further, when the conductive film becomes thin just before the conductive film is removed, even when the magnetic field appropriately emitting is given, a part of the flux penetrating the conductive film appears. Rapid change which appears when the film is in a thin conductive film state in the vicinity of this endpoint is monitored. Thereby, the algorism detecting the frequency, the inductor, and its signal is configured to maximize the flexion point in the vicinity of the endpoint.

The invention provides a method of forecasting and detecting the polishing endpoint, wherein the high frequency inductor type sensor close to the conductor film is a two-dimensional planar inductor.

According to this configuration, in the conventional inductor formed in three-dimensional, the directivity by which the flux infiltrates the conductive film in a vertical direction is improved, and deep into a device wafer, the flux enters so that the wiring inside the device was often broken by electromigration. In contrast to this, according to the method by the two-dimensional planar inductor, the flux for the conductive film is appropriately diffused and does not have the directivity, and therefore, does not positively infiltrate inside the conductive film. Further, when the frequency to be given is a frequency equal to or higher than 30 MHz, the flux is unable to infiltrate deep inside the conductive film due to the skin effect, so that electromigration due to the breaking of the wiring by the Joule heat due to the generation of the eddy current inside the device wafer and the excessive current can be prevented. Further, when the conductive film on the surface becomes a film thickness in a state of just to be removed, a part of the flux penetrates the conductive film, thereby form the eddy current, and when the film becomes a film thickness of the vicinity of the endpoint, this allows a change of the waveform corresponding to very remarkable mutual inductance to be generated, and thus, the endpoint of the polishing can be detected.

The invention provides a method of forecasting and detecting the polishing endpoint, wherein a high frequency inductor type sensor close to the conductor film is configured to attach a conductive film on the surface of the substrate formed by an insulating material.

According to the configuration, a conductive material such as Cu is evaporated or coated on glass/epoxy such as a printed-circuit board and an insulating substrate such as paper/phenol, so that a sensor can be easily fabricated at a low cost. Further, comparing with a method of using a wound wire, the sensor is fabricated by coating the conductive film and, after that, applying etching, so that the line width can be made extremely thin, and the sensor itself can be made extremely miniaturized. By the miniaturization of the sensor, even microscopic magnetic field can be effectively generated, and without allowing the magnetic field to deeply infiltrate inside the conductive material, the changing behavior in the vicinity of the endpoint at which the film is removed can be precisely detected. Further, since the miniaturization of the sensor allows a number of sensors to be arranged by corresponding to the position inside the wafer surface, the uniformity of the polishing inside the wafer surface can be precisely detected.

The invention provides a method of forecasting and detecting the polishing endpoint wherein a monitoring of the flux change induced based on the skin effect of the predetermined conductive film is at least any of the measurement of the eddy current inside the predetermined conductive film, the measurement of the mutual inductance generated by the generation of the eddy current by the predetermined conductive film, the measurement of the inductance change of the sensor circuit system in the high frequency inductor type sensor by the mutual inductance of the predetermined conductive film or the measurement of the inductance change of the sensor circuit system by the change of the resonance frequency oscillated by the high frequency inductance type sensor.

According to the configuration, a monitoring of the flux change induced based on the skin effect of the predetermined conductive film measures at least any change of the eddy current accompanied with the flux change, the mutual inductance, the inductance of the sensor circuit system or the resonance frequency oscillated by the high frequency inductor type sensor, so that the film thickness reference point short of the polishing endpoint is detected, in which the flux penetrating the predetermined conductive film increases by the progress of the polishing.

The invention provides a method of forecasting and detecting the polishing endpoint, wherein an oscillator allowing the high frequency inductor type sensor to oscillate and a frequency counter to monitor the change of the oscillation (resonance) frequency are arranged close to the high frequency inductor type sensor.

According to the configuration, inductance and capacitance of the circuit is prevented from becoming unnecessarily large by forming a distributed constant circuit by the conventional wiring/wiring connection portion, and for example, the change by an electrostatic capacity is not dominantly detected, but the change of the flux brought to the vicinity of the inductor type sensor can be precisely detected. Preferably, the oscillator and the frequency counter may be placed inside the same package as the inductor type sensor. Further, generally, in the several tens MHz band, the distributed constant circuit is formed, and an electrostatic coupling is generated between a passage halfway and a sample rather than by the change of the flux, and the function as the electrostatic coupling becomes dominant. However, according to the configuration, even if the band is a several tens MHz band, since a frequency monitor is arranged in the vicinity, the area in which the electrostatic coupling occurs is limited. Therefore, even if the band is several tens MHx band, rather than as a distributed constant circuit, the configuration functions as a lumped circuit in which capacitance and inductance are relatively constant, and the change of the mutual inductance given to the inductor by the conductive material working as its reaction can be precisely detected by the flux exerted on the conductive material by the inductance.

The invention provides a method of forecasting and detecting the polishing endpoint, wherein the change of the flux induced based on the skin effect of the predetermined conductive film, the change of the eddy current, the change of the mutual inductance and the change of the resonance frequency include two of the changes by the increase of the penetrating flux accompanied with the decrease of the film thickness and the change by the substantial decrease of the eddy current forming area accompanied with the subsequent decrease of the film thickness.

According to the configuration, when the predetermined conductive film becomes below a film thickness corresponding to the skin depth by the progress of the polishing, together with the increase of the penetrating flux, the eddy current and the mutual inductance increase respectively, and accompanied with the increase of the mutual inductance, the inductance of the sensor circuit system decreases and the resonance frequency increases. After that, accompanied with the decrease of the film thickness by further progress of the polishing, the eddy current formation area substantially decreases, and the eddy current and the mutual inductance rapidly decreases, and the inductance of the sensor circuit system rapidly increases and the resonance frequency rapidly decreases. By these behaviors, after the predetermined conductive film becomes a film thickness corresponding to the skin depth, a peak (flexion point) is generated in the waveform of the eddy current, the mutual inductance and the resonance frequency. Based on this peak (flexion point), a film thickness reference point short of an endpoint of the polishing is clearly detected.

The invention provides a method of forecasting and detecting the polishing endpoint, wherein the inductor of the high frequency inductor type sensor is brought close to the predetermined conductive film, and accompanied with the decrease of the film thickness in the polishing process, an inductance shape and a frequency band are selected so as to raise the mutual inductance induced in the conductive film by the increase of the flux penetrating the conductive film of the polishing object, and the flux change induced in the predetermined conductive film by the flux formed by the inductor is monitored, and based on the flux change generated by the skin effect by the film thickness during polishing, a film thickness reference point is detected, and from the film thickness reference point, the polishing endpoint is forecast.

According to the configuration, the skin depth in the predetermined conductive film is decided by depending on the quality of the material of the predetermined conductive film and the oscillation frequency of the high frequency inductor type sensor. The oscillation frequency is selected such that the skin depth is smaller than the initial film thickness of the predetermined conductive film and larger than the predetermined film thickness at the final stage of the polishing, and further, accompanied with the decrease of the film thickness, the predetermined conductive film takes an inductor shape in which the penetrating flux increases, so that the flux induced in the predetermined conductive film passes through the area of the skin depth along the film surface approximately in parallel, and when the predetermined conductive film becomes below a film thickness corresponding to the skin depth by the progress of the polishing, the penetrating flux penetrating the conductive film of the polishing object is generated, and accompanied with the increase of the penetrating flux, the eddy current and the mutual inductance increase. After that, accompanied with the decrease of the film thickness by further progress of the polishing, the eddy current forming area substantially decreases, and the eddy current and the mutual inductance rapidly decrease. From these behaviors, after the predetermined conductive film becomes a film thickness corresponding to the skin depth, a film thickness reference point is detected.

The invention provides a method of forecasting and detecting the polishing endpoint, wherein the frequency band to be selected is 20 MHz or more when the material of the predetermined conductive film is Cu.

According to the configuration, the frequency band oscillated from the high frequency inductor type sensor is, specifically, 20 MHz or more in the case of Cu, so that the skin depth is in an order equivalent to the initial film thickness of the predetermined conductive film, and is smaller than the initial film thickness of the predetermined conductive film, and moreover, is set larger than the film thickness of the predetermined conductive film at the final stage of the polishing.

The invention provides a polishing endpoint forecasting and detecting method to forecast and detect a polishing endpoint when a predetermined conductive film is appropriately removed by polishing a conductive film, wherein an inductor in the high frequency inductor type sensor is brought close to the predetermined conductive film, and at least a part of the flux from among the fluxes formed by the inductor in the initial stage of the polishing allows a frequency such as not penetrating the predetermined conductive film to oscillate from the high frequency inductor type sensor by the skin effect of the predetermined conductive film, and has a process at least once, in which a part of the flux penetrating the conductive film according to the progress of the polishing increases, and from among the fluxes formed by the inductor, the change of the leakage flux penetrating the predetermined conductive film during the progress of the polishing is monitored, and the film thickness during the polishing detects a film thickness reference point based on the change of the leakage flux accompanied with the skin effect, and from the film thickness reference point, the polishing endpoint is forecast.

According to this configuration, the flux formed by the inductor hardly penetrates the predetermined conductive film at the initial stage of the polishing, and the frequency oscillated from the high frequency inductor type sensor is set so that the skin effect is generated such that the leakage flux penetrating the predetermined conductive film begins to be generated according to the progress of the polishing. Based on the change of the leakage flux after the predetermined conductive film becomes a film thickness corresponding to the skin depth by the progress of the polishing, a film thickness reference point is detected, and from this film thickness reference point, the polishing endpoint is forecast.

The invention is a method of forecasting and detecting the polishing endpoint to forecast and detect the polishing endpoint when the predetermined conductive film is appropriately removed by polishing the conductive film, wherein the inductor in the high frequency inductor type sensor is brought close to the predetermined conductive film, and at least a part of the flux from among the fluxes formed by the inductor in the initial stage of the polishing allows an inductor shape generating the magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating the predetermined conductive film increases according to the progress of the polishing, and from among the fluxes formed by the inductor, the change of the leakage flux penetrating the predetermined conductive film during the progress of the polishing is monitored as the change of the eddy current created by the leakage flux, and based on the change of the eddy current when the film thickness during the polishing becomes equivalent to the skin depth accompanied with the skin effect or its vicinity, a film thickness reference point is detected, and from the film thickness reference point, a method of forecasting and detecting the polishing endpoint to forecast the polishing endpoint is provided.

According to the configuration, the frequency oscillated from the high frequency inductor type sensor is set similarly to the operation of the invention according to another embodiment, and from the inductor, according to the shape, the magnetic field having no directivity to the extent of not penetrating the predetermined conductive film by the skin effect of the predetermined conductive film is generated in the initial stage of the polishing. The change of the leakage flux generated accompanied with the progress of the polishing is monitored as the change of the eddy current, and based on the change of the eddy current after the predetermined conductive film becomes a film thickness corresponding the skin depth by the progress of the polishing, a film thickness reference point is detected, and the polishing endpoint is forecast from the film thickness reference point.

The invention relates to a method of forecasting the polishing endpoint from the film thickness reference point, and provides a method of forecasting and detecting the polishing endpoint which ends the polishing after having polished for the polishing time set in advance from the film thickness reference point.

According to the configuration, a film thickness reference point is detected at the point of time when the remaining film amount becomes a film thickness corresponding to the skin depth. Therefore, from a polishing rate to be executed after a film thickness reference point is detected, a required polishing time after the detection of a film thickness reference point can be set in advance. Consequently, after a film thickness reference point is detected, the polishing is terminated by polishing for the polishing time set in advance.

The invention relates to a method of forecasting and detecting from the film thickness reference point to the polishing endpoint, and from the time having reached a film thickness reference point from the initial stage of the polishing and from a polishing amount up to the film thickness reference point, the polishing rate thereof is calculated, and by dividing the film thickness of the film thickness reference point by the polishing rate, the remaining polishing time required from the film thickness reference point to the polishing endpoint is calculated, and after the polishing is performed for the time calculated from the film thickness reference point, a method of forecasting and detecting the polishing endpoint taken as an endpoint of the polishing is provided.

According to the configuration, from the time in which a film thickness reference point is detected from the initial stage of the polishing and the polishing amount reaching a film thickness reference point, the polishing rate during that time is calculated. By dividing a film thickness corresponding to the skin depth which is the remaining film amount in the film thickness point reference by the polishing rate, the required polishing time after the detection of a film thickness reference point is calculated. Consequently, after the detection of a film thickness reference point, the polishing is terminated by polishing for the polishing time calculated.

The invention is a method of forecasting and detecting the polishing endpoint to forecast and detect the polishing endpoint when the predetermined conductive film is appropriately removed by polishing the conductive film, wherein the inductor in the high frequency inductor type sensor is brought close to the predetermined conductive film, and at least a part of the flux from among the fluxes formed by the inductor in the initial stage of the polishing allows an inductor shape generating the magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating at least a part of the predetermined conductive film increases according to the progress of the polishing, and from among the fluxes formed by the inductor, the change of the eddy current generated by the change of the leakage flux penetrating the predetermined conductive film during the progress of the polishing is monitored as the change of the mutual inductance generated in the inductor by the eddy current, and based on the change of the mutual inductance when the film thickness during the polishing becomes equivalent to the skin depth accompanied with the skin effect or its vicinity, a film thickness reference point is detected, and the method of forecasting and detecting the polishing endpoint to forecast an endpoint of the polishing from the film thickness reference point is provided.

According to the configuration, the frequency oscillated from the high frequency inductor type sensor is set similarly to the operation of the invention, and from the inductor, according to the shape, the magnetic field having no directivity to the extent of not penetrating the predetermined conductive film by the skin effect of the predetermined conductive film is generated in the initial stage of the polishing. The change of the leakage flux generated accompanied with the progress of the polishing is monitored as the change of the mutual inductance generated in the inductor, and based on the change of the mutual inductance after the predetermined conductive film becomes a film thickness corresponding to the skin depth by the progress of the polishing, a film thickness reference point is detected, and the polishing endpoint is forecast from this film thickness reference point.

The invention is a method of forecasting and detecting the polishing endpoint to forecast and detect the polishing endpoint when the predetermined conductive film is appropriately removed by polishing the conductive film, wherein the inductor in the high frequency inductor type sensor is brought close to the predetermined conductive film, and at least a part of the flux from among the fluxes formed by the inductor in the initial stage of the polishing allows the inductor shape generating the magnetic field having no directivity to the extent of not penetrating the predetermined conductive film by the skin effect of the predetermined conductive film and the frequency to the extent of not penetrating the predetermined conductive film by the skin effect to oscillate from the high frequency inductor type sensor, and has a process at least once, in which the flux penetrating at least a part of the conductive film increases according to the progress of the polishing, and from among the fluxes formed by the inductor, the change of the inductance of the sensor circuit system in the high frequency inductor type sensor based on the change of the leakage flux penetrating the predetermined conductive film during the progress of the polishing is monitored as the change of the resonance frequency decided by the inductance and an inherent capacity of the sensor circuit system, and based on the change of the resonance frequency when the film thickness during the polishing becomes a film thickness corresponding to the skin effect, a film thickness reference point is detected, and the method of forecasting and detecting the polishing endpoint to forecast the polishing endpoint from this film thickness reference point is provided.

According to the configuration, the frequency oscillated from the high frequency inductor type sensor is set similarly to the operation of the invention, and from the inductor, according to the shape, the magnetic field having no directivity to the extent of not penetrating the predetermined conductive film by the skin effect of the predetermined conductive film is generated in the initial stage of the polishing, and accompanied with the progress of the polishing, the leakage flux penetrating the predetermined conductive film is generated. The change of the inductance of the sensor circuit system in the high frequency inductor type sensor accompanied with the change of the leakage flux is monitored as the change of the resonance frequency decided by the inductance and the inherent capacity of the sensor circuit system, and based on the change of the resonance frequency after the predetermined conductive film becomes a film thickness corresponding the skin depth by the progress of the polishing, a film thickness reference point is detected, and the polishing endpoint is forecast from the film thickness reference point.

The invention is a method of forecasting and detecting the polishing endpoint to forecast and detect the polishing endpoint when the predetermined conductive film is appropriately removed by polishing the conductive film, wherein the inductor in the high frequency inductor type sensor is brought close to the predetermined conductive film, and at least a part of the fluxes formed by the inductor in the initial stage of the polishing allows an inductor shape generating the magnetic field having no directivity to the extent of not penetrating the predetermined conductive film by the skin effect of the predetermined conductive film and the frequency to the extent of not penetrating the predetermined conductive film by the skin effect to oscillate from the high frequency inductor type sensor, and has a process at least once, in which the flux penetrating at least a part of the conductive film increases according to the progress of the polishing, and from among the fluxes formed by the inductor, at least whichever change of the eddy current generated by the change of the leakage flux penetrating the predetermined conductive film during the progress of the polishing, the change of the mutual inductance generated in the inductor by the change of the eddy current or the change of the resonance frequency oscillated from the high frequency inductor type sensor by the change of the inductance of the sensor circuit system in the high frequency inductor type sensor based on the change of the mutual inductance is monitored, and based on at least whichever change from among each of the changes when the film thickness during the polishing becomes a film thickness corresponding to the skin effect, a film thickness reference point is detected, and from the film thickness reference point, the method of forecasting and detecting the polishing endpoint to forecast the polishing endpoint is provided.

According to the configuration, the frequency oscillated from the high frequency inductor type sensor is set similarly to the operation of the invention according to another embodiment, and from the inductor, according to the shape, the magnetic field having no directivity to the extent of not penetrating the predetermined conductive film by the skin effect of the predetermined conductive film is generated in the initial stage of the polishing, and accompanied with the progress of the polishing, the leakage flux penetrating the predetermined conductive film is generated. At least any change from among the change of the eddy current generated by the change of the leakage flux, the change of the mutual inductance accompanied with the change of the eddy current or the change of the resonance frequency oscillated from the high frequency inductor type sensor based on the change of the mutual inductance is monitored, and based on at least any change from among the changes of the eddy current, the change of the mutual conductance or the change of the resonance frequency after the predetermined conductive film becomes a film thickness corresponding to the skin depth by the progress of the polishing, a film thickness reference point is detected, and the polishing endpoint is forecast from the film thickness reference point.

The invention provides a method of forecasting and detecting the polishing endpoint, wherein, during each change of the eddy current, the mutual inductance or the resonance frequency when the film thickness of the predetermined conductive film during the polishing becomes a film thickness corresponding to the skin depth, the maximum point (peak) is generated by the actions of two phenomena of an increase of the eddy current by the increase of the leakage flux generated by a film thickness corresponding to the skin depth and a decrease of the eddy current forming area accompanied with the decrease of a film thickness volume by the polishing operation, and based on the maximum point (peak), a film thickness reference point is detected.

According to the configuration, in addition to the operation of the invention according to another configuration, during each change of the eddy current, the mutual inductance or the resonance frequency when the predetermined conductive film becomes a film thickness corresponding to the skin depth by the progress of the polishing, the maximum point (peak) is generated. Based on this maximum point (peak), a film thickness reference point is detected.

The invention is a real time film thickness monitoring method which monitors the change of the film thickness during the progress of the polishing to evaluate whether the predetermined conductive film is appropriately removed, wherein the inductor in the high frequency inductor type sensor is brought close to the predetermined conductive film, and at least a part of the flux from among the fluxes formed by the inductor in the initial stage of the polishing allows the frequency to the extent of not penetrating the predetermined conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the leakage flux penetrating the predetermined conductive film during the progress of the polishing is monitored, and from the change of the leakage flux when the film thickness during the polishing becomes a film thickness corresponding to the skin effect, a film thickness reference point is detected, and a real time film thickness monitoring method which calculates on the spot the polishing rate and a remaining film thickness amount to be removed based on a film thickness reference point is provided.

According to the configuration, the flux formed by the inductor hardly penetrates the predetermined conductive film at the initial stage of the polishing, and the frequency oscillated from the high frequency inductor type sensor is set so that the skin effect is generated such that the leakage flux penetrating the predetermined conductive film begins to be generated according to the progress of the polishing. From the change of the leakage flux after the predetermined conductive film becomes a film thickness corresponding to the skin depth by the progress of the polishing, a film thickness reference point is detected, and from the remaining film amount to be removed which is approximately equivalent to the skin depth based on a film thickness reference point and the film thickness amount already polished and removed and the time required thereof, each polishing data such as a polishing rate is calculated on the spot, and whether the predetermined conductive film is appropriately removed is evaluated.

The invention provides a real time film thickness monitoring method monitoring the change of the film thickness during the progress of the polishing to evaluate whether the predetermined conductive film is appropriately removed, wherein the inductor in the high frequency inductor type sensor is brought close to the predetermined conductive film, and at least a part of the flux from among the fluxes formed by the inductor in the initial stage of the polishing allows the frequency to the extent of not penetrating the conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the leakage flux penetrating the predetermined conductive film during the progress of the polishing is monitored as the change of the eddy current created by the leakage flux, and from the change of the leakage flux when the film thickness during the polishing becomes a film thickness corresponding to the skin effect, a film thickness reference point is detected, and a real time film thickness monitoring method of calculating on the spot a polishing rate and the remaining film thickness amount to be removed based on a film thickness reference point is provided.

According to the configuration, the frequency oscillated from the high frequency inductor type sensor is set similarly to the operation of the invention according to another configuration. The change of the leakage flux is monitored as the change of the eddy current, and from the change of the eddy current after the predetermined conductive film becomes a film thickness corresponding to the skin depth by the progress of the polishing, a film thickness reference point is detected, and from the remaining film amount to be removed which is approximately equivalent to the skin depth based on a film thickness reference point and the film thickness amount already polished and removed and the time required thereof, each polishing data such as a polishing rate is calculated on the spot, and whether the predetermined conductive film is appropriately removed is evaluated.

The invention provides a real time film thickness monitoring method monitoring the change of the film thickness during the progress of the polishing to evaluate whether the predetermined conductive film is appropriately removed, wherein the inductor in the high frequency inductor type sensor is brought close to the predetermined conductive film, and at least a part of the flux from among the fluxes formed by the inductor in the initial stage of the polishing allows the frequency to the extent of not penetrating the conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the eddy current generated by the change of the leakage flux penetrating the predetermined conductive film during the progress of the polishing is monitored as the change of the mutual inductance generated in the inductor by the eddy current, and from the change of the leakage flux when the film thickness during the polishing becomes a film thickness corresponding to the skin effect, a film thickness reference point is detected, and a real time film thickness monitoring method of calculating on the spot the polishing rate and a remaining film thickness amount to be removed based on a film thickness reference point is provided.

According to the configuration, the frequency oscillated from the high frequency inductor type sensor is set similarly to the operation of the invention according to another configuration. The change of the leakage flux is monitored as the change of the mutual inductance generated in the inductor, and from the change of the mutual inductance after the predetermined conductive film becomes a film thickness corresponding to the skin depth by the progress of the polishing, a film thickness reference point is detected, and from the remaining film amount to be removed which is approximately equivalent to the skin depth based on a film thickness reference point and the film thickness amount already polished and removed and the time required thereof, each polishing data such as a polishing rate is calculated on the spot, and whether the predetermined conductive film is appropriately removed is evaluated.

The invention provides a real time film thickness monitoring method monitoring the change of the film thickness during the progress of the polishing to evaluate whether the predetermined conductive film is appropriately removed by polishing the conductive film, wherein the inductor in the high frequency inductor type sensor is brought close to the predetermined conductive film, and at least a part of the flux from among the fluxes formed by the inductor in the initial stage of the polishing allows the frequency to the extent of not penetrating the predetermined conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the inductance of the sensor circuit system in the high frequency inductor type sensor based on the change of the leakage flux penetrating the predetermined conductive film during the progress of the polishing is monitored as the change of the resonance frequency decided by the inductance and the inherent capacity of the sensor circuit system, and from the change of the resonance frequency when the film thickness during the polishing becomes a film thickness corresponding to the skin effect, a film thickness reference point is detected, and based on this film thickness reference point, the real time film thickness monitoring method of calculating on the spot the polishing rate and the film thickness amount to be removed is provided.

According to this configuration, the frequency oscillated from the high frequency inductor type sensor is set similarly to the operation of the invention according to another configuration. The change of the inductance of the sensor circuit system in the high frequency inductor sensor accompanied with the change of the leakage flux is monitored as the change of the resonance frequency decided by the inductance and the inherent capacity of the sensor circuit system, and from the change of the resonance frequency after the predetermined conductive film becomes a film thickness corresponding to the skin depth by the progress of the polishing, a film thickness reference point is detected, and from the remaining film amount to be removed which is approximately equivalent to the skin depth based on a film thickness reference point and the film thickness amount already polished and removed and the time required thereof, each polishing data such as a polishing rate is calculated on the spot, and whether the predetermined conductive film is appropriately removed is evaluated.

The invention provides a real time film thickness monitoring method, wherein, during each change of the eddy current, the mutual inductance or the resonance frequency when the film thickness of the predetermined conductive film during the polishing becomes a film thickness equivalent to the skin depth or its vicinity, a peak is generated by the actions of two phenomena of an increase of the eddy current by the increase of the leakage flux by the skin effect and a decrease of the eddy current accompanied with the decrease of the film thickness volume by the polishing, and based on this peak, a film thickness reference point is detected.

According to the configuration, in addition to the operations of the invention according to other configurations, during each change of the eddy current, the mutual inductance or the resonance frequency after the predetermined conductive film becomes a film thickness corresponding to the skin depth by the progress of the polishing, a peak is generated. Based on the peak, the detection of a film thickness reference point is performed.

The invention includes a high frequency inductor type sensor comprising an oscillation circuit forming a sensor circuit system comprised of a planar inductor and a capacitor, and is a polishing endpoint forecasting and detecting device to forecast and detect the polishing endpoint when the predetermined conductive film is appropriately removed by polishing the conductive film, and provides a polishing endpoint forecasting and detecting device to execute a method of forecasting and detecting the polishing endpoint according to other embodiments.

According to the configuration, the polishing endpoint forecasting and detecting device including the high frequency inductor type sensor comprising the oscillation circuit comprised of the planar inductor and the capacitor sets an oscillation frequency of the high frequency inductor type sensor so that the skin depth in the predetermined conductive film is smaller than the initial film thickness of the predetermined conductive film and becomes larger than the predetermined conductive film at the final stage of the polishing. As a result, the flux induced in the predetermined conductive film by the flux formed by the planar inductor at the initial stage of the polishing passes through a skin depth area along a film surface approximately in parallel, and according to the progress of the polishing, at least a part of the flux penetrates the predetermined conductive film so as to begin to generate a leakage flux. From among the change of the leakage flux during the progress of the polishing, the change of the eddy current generated by the change of the leakage flux, the change of the mutual inductance generated in the planar inductor by the change of the eddy current or the change of a resonance frequency oscillated from the high frequency inductor type sensor by the change of the inductance of the sensor circuit system based on the change of the mutual inductance, at least any of the changes is monitored, and based on at least any change from among each of the changes after the predetermined conductive film becomes a film thickness corresponding to the skin depth, a film thickness reference point short of an endpoint of the polishing is detected, and from the film thickness reference point, the polishing endpoint is forecast.

The invention is a real time film thickness monitor device which includes a high frequency inductor type sensor comprising an oscillation circuit comprised of a planar inductor and a capacitor, and monitors the film thickness change during the progress of the polishing to evaluate whether the conductive film is polished and the predetermined conductive film is appropriately removed, and provides a real time film thickness monitor device to execute the real time film thickness monitoring method according to other embodiments.

According to the configuration, the real time film thickness monitor device which includes the high frequency inductor type sensor comprising the oscillation circuit comprised of the planar inductor and the capacitor sets an oscillation frequency of the high frequency inductor type sensor so that a skin depth in the predetermined conductive film is smaller than the initial film thickness of the predetermined conductive film and becomes larger than the film thickness of the predetermined conductive film at the final stage of the polishing. As a result, the flux induced in the predetermined conductive film by the flux formed by the planar inductor at the initial stage of the polishing passes through a skin depth area along a film surface approximately in parallel, and according to the progress of the polishing, at least a part of the flux penetrates the predetermined conductive film so as to begin to generate a leakage flux. From among the change of the leakage flux during the progress of the polishing, the change of the eddy current generated by the change of the leakage flux, the change of the mutual inductance generated in the planar inductor by the change of the eddy current or the change of a resonance frequency oscillated from the high frequency inductor type sensor by the change of the inductor of the sensor circuit system based on the change of the mutual inductance, at least any of the changes is monitored, and based on at least any change from among each of the changes after the predetermined conductive film becomes a thickness corresponding to the skin depth, a film thickness reference point short of an endpoint of the polishing is detected, and based on the film thickness reference point, the remaining film amount to be removed which is approximately equivalent to the skin depth and the film thickness amount already polished and removed and the time required thereof, each polishing data such as a polishing rate is calculated on the spot, and whether the predetermined conductive film is appropriately removed is evaluated.

The invention brings an inductor in a high frequency inductor type sensor close to the predetermined conductive film, and monitors a flux change induced in the predetermined conductive film by the flux formed by the inductor, and based on the flux change by the skin effect in which a film thickness during the polishing is decided with the material of the predetermined conductive film as a factor, a film thickness reference point is detected, and from the film thickness reference point, the polishing endpoint is forecast. Therefore, during the initial stage of the polishing, the flux induced in the predetermined conductive film passes through the skin depth area along a film surface approximately in parallel. As a result, without exerting a strong flux up to the microscopic wiring and the like formed inside the film and with the generation of the eddy current suppressed, Joule heat loss due to the eddy current can be suppressed to the minimum. After the predetermined conductive film becomes a film thickness corresponding to the skin depth by the progress of the polishing, a leakage flux penetrating the predetermined conductive film is generated, and by the leakage flux, an eddy current is induced in the predetermined conductive film. The eddy current gradually increases by the increase of the leakage flux accompanied with the decrease of the film thickness, and by further decrease of the film thickness, the conductive film itself which generates the eddy current decreases, and thus, the eddy current rapidly decreases. By the increase of this eddy current and the rapid decrease thereafter, the inductance of the sensor circuit system decreases once, and after that, turns to increase. By this behavior, the waveform of the resonance frequency oscillated from the high frequency inductor type sensor is generated with a peak (flexion point). The peak (flexion point) is not fluctuated by various disturbances, and appears at a position corresponding to the remaining film thickness constantly. Therefore, an advantage is afforded that the polishing endpoint can be precisely forecast and detected from a film thickness reference point detected based on this peak (flexion point).

The invention takes the high frequency inductor type sensor close to the conductive film as a two-dimensional planar inductor, and therefore, the flux formed by the two-dimensional planar inductor diffuse appropriately to the predetermined conductor film and does not have directivity. Therefore, until the predetermined conductive film becomes a film thickness corresponding to a skin depth by the progress of the polishing, this flux does not positively intrude inside the predetermined conductive film. In addition to this, due to a skin effect, the flux is unable to intrude inside the conductive film, and this affords the advantage that electromigration by the breaking of the wiring by the joule heat due to the generation of the eddy current inside the device wafer and the excessive current can be effectively prevented.

The invention configures a high frequency inductor type sensor close to the conductive film to be attached with a conductive film on the surface of the substrate formed with an insulating material, and therefore, by evaporating or coating a conductive material on the substrate of an insulating material such as glass/epoxy and paper/phenol, a sensor can be easily fabricated at a low cost. Further, after depositing the conductive film on the substrate of the insulating material, the sensor is fabricated by etching and the like, so that the line width can be made extremely thin, and the sensor itself can be extremely miniaturized. By the miniaturization of the sensor, a microscopic magnetic field can be effectively generated, and the advantage is afforded that without allowing the magnetic field to intrude deep inside the conductive film, the changing behavior in the vicinity of the endpoint from which the conductive film is removed can be precisely detected.

The invention, wherein a monitoring of a flux change induced based on the skin effect of the predetermined conductive film is intended for at least any of the measurement of an eddy current in the predetermined conductive film, the measurement of a mutual inductance generated by the generation of the eddy current by the predetermined conductive film, the measurement of an inductance change of a senor circuit system in the high frequency inductor type sensor by the mutual inductance of the predetermined conductive film or the measurement of the inductance change of the sensor circuit system by the change of the resonance frequency oscillated by the high frequency inductor type sensor, so that the advantage is afforded that the monitoring of the flux change induced in the predetermined conductive film in the invention is able to more clearly detect a film thickness reference point short of the polishing endpoint specifically by using at least any of the change of the eddy current, the mutual inductance, the inductance of the sensor circuit system accompanied with the flux change or the resonance frequency oscillated by the high frequency inductor type sensor.

The invention arranges an oscillator allowing an high frequency inductor type sensor to oscillate and a frequency counter to monitor the change of the oscillation (resonance) frequency close to the high frequency inductor type sensor, and therefore, in the wiring/connection wiring portion between the oscillator allowing the high frequency inductor type sensor to oscillate and the frequency counter or the like, a distributed constant circuit is formed to prevent an inductance and a capacitance from becoming unnecessarily large, so that the change of the flux accompanied with the progress of the polishing of the conductive film close to the vicinity of the high frequency inductor type sensor can be precisely detected.

The invention allows the change of the flux induced based on the skin effect of the predetermined conductive film, the change of the eddy current, the change of the mutual conductance, and the change of the resonance frequency to include two changes of the change by the increase of the penetrating flux accompanied with the decrease of the film thickness and the change by the substantial decrease of an eddy current forming area accompanied with the subsequent decrease of the film thickness, therefore, when the predetermined conductive film becomes below a film thickness corresponding to a skin depth by the progress of the polishing, the eddy current, the mutual inductance, and the resonance frequency increase together with the increase of the penetrating flux. After that, accompanied with the decrease of the film thickness by further progress of the polishing, the eddy current forming area substantially decreases, and the eddy current, the mutual inductance, and the resonance frequency rapidly decrease. By these behaviors, after the predetermined conductive film becomes a film thickness corresponding to the skin depth, the wave forms of the eddy current, the mutual inductance, and the resonance frequency are generated with a peak (flexion point), and based on the peak (flexion point), the advantage is afforded that a film thickness reference point can be clearly detected.

The invention allows the inductor of the high frequency inductor type sensor to be brought close to the predetermined conductive film, and accompanied with the decrease of the film thickness in the polishing process, selects an inductance shape and a frequency band so as to raise the mutual inductance induced in the conductive film by the increase of the flux penetrating the conductive film of the polishing object, and the flux change induced in the predetermined conductive film by the flux formed by the inductor is monitored, and based on the flux change generated by the skin effect by the film thickness during the polishing, a film thickness reference point is detected, and from the film thickness reference point, the polishing endpoint is forecast, therefore, the flux induced in the predetermined conductive film at the initial stage of the polishing passes through a skin depth area along a film surface approximately in parallel, and after the predetermined conductive film becomes a film thickness corresponding to the skin depth by the progress of the polishing, a penetrating flux penetrating the conductive film is generated, and together with the increase of the penetrating flux, the eddy current and the mutual inductance increase. After that, accompanied with the decrease of the film thickness by further progress of the polishing, the eddy current forming area substantially decreases, and the eddy current and the mutual conductance rapidly decrease. From these behaviors, a film thickness reference point is detected, and from this film thickness reference point, the advantage is afforded that the polishing endpoint is precisely forecast.

The invention takes the frequency band to be selected as 20 MHz or more when the material of the predetermined conductive film is Cu, and therefore, when the material of the predetermined film is Cu, the skin depth is smaller than the initial film thickness of the predetermined conductive film in the initial stage of the polishing, and by the progress of the polishing, when coming short of the endpoint of the polishing, the conductive film becomes a film thickness corresponding to the skin depth, thereby the advantage is afforded that the leakage flux penetrating the predetermined conductive film can be generated.

The invention brings the inductor in the high frequency inductor type sensor close to the predetermined conductive film, and a part of the flux from among the fluxes formed by the inductor in the initial stage of the polishing allows a frequency not penetrating the predetermined conductive film by the skin effect of the predetermined conductive film to be oscillated from the high frequency inductor type sensor, and has a process at least once, in which at least a part of the flux penetrating the conductive film increases according to the progress of the polishing, and from among the fluxes formed by the inductor, the change of the leakage flux penetrating the predetermined conductive film during the progress of the polishing is monitored, and the film thickness during the polishing detects a film thickness reference point based on the change of the leakage flux accompanied with the skin effect, and from the film thickness reference point, the polishing endpoint is forecast, so that the leakage flux penetrating the predetermined conductive film is generated after the predetermined conductive film becomes a film thickness corresponding to a skin depth, and based on the change of the leakage flux, a film thickness reference point short of the polishing endpoint is detected. Consequently, the advantage is afforded that from the film thickness reference point, polishing endpoint can be precisely forecast and detected.

The invention brings the inductor in the high frequency inductor type sensor close to the predetermined conductive film, and at least a part of the flux from among the fluxes formed by the inductor in the initial stage of the polishing allows an inductor shape generating a magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating the predetermined conductive film increases according to the progress of the polishing, and from among the fluxes formed by the inductor, the change of the leakage flux penetrating the predetermined conductive film during the progress of the polishing is monitored as the change of the eddy current created by leakage flux, and based on the change of the eddy current when the film thickness during the polishing becomes equivalent to the skin depth accompanied with the skin effect or its vicinity, a film thickness reference point is detected, and from the film thickness reference point, the polishing endpoint is forecast, so that, from the inductor by its shape, a magnetic field having no directivity to the extent of not penetrating the predetermined conductive film is generated by the skin effect of the predetermined conductive film in the initial stage of the polishing, so that a strong flux is not exerted up to the microscopic wiring and the like formed inside the film, and moreover, the generation of the eddy current is suppressed so that the Joule heat loss due to the eddy current can be suppressed to the minimum. After the predetermined conductive film becomes a film thickness corresponding to the skin depth by the progress of the polishing, a leakage flux penetrating the predetermined conductive film is generated, and based on the change of the eddy current accompanied with the change of the leakage flux, a film thickness reference point is detected. Consequently, the advantage is afforded that, from the film thickness reference point, the polishing endpoint can be precisely forecast and detected.

The invention terminates the polishing endpoint after having polished for the polishing time set in advance from the film thickness reference point regarding the method of forecasting the polishing endpoint from the film thickness reference point, so that a film thickness reference point is detected when the remaining film amount becomes a film thickness corresponding to the skin depth. Consequently, from a polishing rate to be executed after the remaining film amount and the film thickness reference point detection, a required polishing time subsequent to the film thickness reference point detection can be set in advance. Consequently, after the polishing is performed for the polishing time set in advance from the detected film thickness reference point, the polishing is terminated, thereby affording the advantage in that the predetermined conductive film can be appropriately polished and removed.

The invention is characterized in that, regarding the method of forecasting from the film thickness reference point to the polishing endpoint, from the time having reached the film thickness reference point from the initial stage of the polishing and a polishing amount up to the film thickness reference point, the polishing rate for that much portion is calculated, and the film thickness at a film thickness reference point is divided by the polishing amount, thereby calculate the remaining polishing time required from the film thickness reference point to the polishing endpoint, and after performing the polishing for the time calculated from the film thickness reference point, the endpoint of the polishing is set, and therefore, by detecting the film thickness reference point, from the time required up to the detection and the polishing amount, the polishing rate during that time can be calculated. When the polishing rate after the detection of a film thickness reference point is taken as equal to the polishing rate before the detection of the film thickness reference point so as to execute the polishing after the detection of a film thickness reference point, the film thickness corresponding to the skin depth serving as the remaining film amount at the film thickness reference point is divided by the polishing rate, so that the required polishing time after the detection of a film thickness reference point is calculated. Consequently, after the detection of the film thickness reference point, by performing the polishing for the calculated polishing time, the advantage is afforded that the predetermined conductive film can be appropriately polished and removed.

The invention brings the inductor in the high frequency inductor type sensor close to the predetermined conductive film, and at least a part of the flux from among the fluxes formed by the inductor in the initial stage of the polishing allows an inductor shape generating a magnetic field having no directivity to the extent of not penetrating the predetermined conductive film by the skin effect of the predetermined conductive film and a frequency to the extent of not penetrating the predetermined conductive film by the skin effect to oscillate from the high frequency inductor type sensor, and has a process at least once, in which the flux penetrating at least a part of the conductive film increases according to the progress of the polishing, and from among the fluxes formed by the inductor, the change of the eddy current generated by the change of the leakage flux penetrating the predetermined conductive film during the progress of the polishing is monitored as the change of the mutual inductance generated in the inductor by the eddy current, and based on the change of the mutual induction when the film thickness during the polishing becomes equivalent to the skin depth accompanied with the skin effect or its vicinity, a film thickness reference point is detected, and from the film thickness reference point, the polishing endpoint is forecast, so that, from the inductor by its shape, a magnetic field having no directivity to the extent of not penetrating the predetermined conductive film is generated by the skin effect of the predetermined conductive film in the initial stage of the polishing, so that a strong flux is not exerted up to the microscopic wiring and the like formed inside the film, and moreover, the generation of the eddy current is suppressed so that the Joule heat loss due to the eddy current can be suppressed to the minimum. After the predetermined conductive film becomes a film thickness corresponding to the skin depth by the progress of the polishing, a leakage flux penetrating the predetermined conductive film is generated, and based on the change of the mutual inductance generated in the inductor by the change of the eddy current accompanied with the change of the leakage flux, a film thickness reference point short of the polishing endpoint is detected. Consequently, the advantage is afforded that, from the film thickness reference point, the polishing endpoint can be precisely forecast and detected.

The invention brings the inductor in the high frequency inductor type sensor close to the predetermined conductive film, and at least a part of the flux from among the fluxes formed by the inductor in the initial stage of the polishing allows an inductor shape generating a magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating at least a part of the conductive film increases according to the progress of the polishing, and from among the fluxes formed by the inductor, the change of an inductance of the sensor circuit system in the high frequency inductor type sensor based on the change of the leakage flux penetrating the predetermined conductive film during the progress of the polishing is monitored as the change of a resonance frequency decided by the inductance and an inherent capacity of the sensor circuit system, and based on the change of the resonance frequency when the film thickness during the polishing becomes a film thickness corresponding to the skin effect, a film thickness reference point is detected, and from the film thickness reference point, the polishing endpoint is forecast, so that, from the inductor by its shape, a magnetic field having no directivity to the extent of not penetrating the predetermined conductive film is generated by the skin effect of the predetermined conductive film in the initial stage of the polishing, so that a strong flux is not exerted up to the microscopic wiring and the like formed inside the film, and moreover, the generation of the eddy current is suppressed so that the Joule heat loss due to the eddy current can be suppressed to the minimum. After the predetermined conductive film becomes a film thickness corresponding to the skin depth by the progress of the polishing, a leakage flux penetrating the predetermined conductive film is generated, and based on the change of the resonance frequency oscillated from the high frequency inductor type sensor due to the change of the inductance of the sensor circuit system accompanied with the change of the leakage flux, the reference film thickness point short of the endpoint of the polishing is detected. Consequently, the advantage is afforded that, from the film thickness reference point, the polishing endpoint can be precisely forecast and detected.

The invention brings the inductor in the high frequency inductor type sensor close to the predetermined conductive film, and at least a part of the flux from among the fluxes formed by the inductor in the initial stage of the polishing allows an inductor shape generating a magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating at least a part of the predetermined conductive film increases according to the progress of the polishing, and from among the fluxes formed by the inductor, at least any of the change of the eddy current generated by the change of the leakage flux penetrating the predetermined conductive film during the progress of the polishing, the change of the mutual conductance generated in the inductor by the change of the eddy current or the change of the resonance frequency oscillated from the high frequency inductor type sensor by the change of the inductance of the sensor circuit system in the high frequency inductor type sensor based on the change of the mutual inductance is monitored, and based on at least any of each change when the film thickness during the polishing becomes a film thickness corresponding to the skin effect, a film thickness reference point is detected, and from the film thickness reference point, the polishing endpoint is forecast, so that, from the inductor by its shape, a magnetic field having no directivity to the extent of not penetrating the predetermined conductive film is generated by the skin effect of the predetermined conductive film in the initial stage of the polishing, so that a strong flux is not exerted up to the microscopic wiring and the like formed inside the film, and moreover, the generation of the eddy current is suppressed so that the Joule heat loss due to the eddy current can be suppressed to the minimum. After the predetermined conductive film becomes a film thickness corresponding to the skin depth by the progress of the polishing, a leakage flux penetrating the predetermined conductive film is generated, and based on at least any of the change of the eddy current accompanied with the change of the leakage flux, the change of the mutual inductance or the change of the resonance frequency oscillated from the high frequency inductor type sensor, a film thickness reference point short of the polishing endpoint is detected. Consequently, the advantage is afforded that, from this film thickness reference point, the polishing endpoint can be precisely forecast and detected.

The invention is characterized in that during each of the changes of the eddy current, the mutual inductance or the resonance frequency when the film thickness of the predetermined conductive film during the polishing becomes a film thickness corresponding to the skin depth, the maximum point (peak) is generated by the actions of two phenomena of the increase of the eddy current by the increase of the leakage flux generated in the film thickness corresponding to the skin depth and the decrease of the eddy current forming area accompanied with decrease of the film thickness volume by the polishing, and based on the maximum point (peak), the film thickness reference point is detected, and therefore, in addition to the effect of the invention, each of the changes of the eddy current, the mutual inductance or the resonance frequency after the predetermined conductive film becomes a film thickness corresponding to the skin depth by the progress of the polishing has a remarkable maximum point (peak) generated, and based on this remarkable maximum point (peak), a film thickness reference point can be precisely detected. Consequently, the advantage is afforded that, from the film thickness reference point, the endpoint of time of the polishing can be precisely forecast and detected.

The invention brings the inductor in the high frequency inductor type sensor close to the predetermined conductive film, and at least a part of the flux from among the fluxes formed by the inductor in the initial stage of the polishing allows a frequency to the extent of not penetrating the predetermined conductive film by the skin effect to oscillate from the high frequency inductor type sensor, and has a process at least once during the polishing, in which the flux penetrating at least a part of the conductive film increases according to the progress of the polishing, and from among the fluxes formed by the inductance, the change of the leakage flux penetrating the predetermined conductive film during the progress of the polishing is monitored, and from the change of the leakage flux when the film thickness during the polishing becomes a film thickness corresponding to the skin effect, a film thickness reference point is detected, and based on this film thickness reference point, the polishing rate and the remaining film thickness amount to be removed is calculated on the spot, and therefore, after the predetermined conductive film becomes a film thickness corresponding to the skin depth by the progress of the polishing, the leakage flux penetrating the predetermined conductive film is generated, and from the change of the leakage flux, a film thickness reference point short of the endpoint of the polishing is detected. Consequently, based on this film thickness reference point, each polishing data such as the remaining film amount to be removed and the polishing rate can be precisely calculated on the spot, whether the predetermined conductive film is appropriately removed is accurately evaluated, and the advantage is afforded that the Joule heat loss due to the eddy current generated by the leakage flux can be suppressed to the minimum.

The invention brings the inductor in the high frequency inductor type sensor close to the predetermined conductive film, and at least a part of the flux from among the fluxes formed by the inductor in the initial stage of the polishing allows a frequency to the extent of not penetrating the predetermined conductive film by the skin effect of the predetermined conductive film to be oscillated from the high frequency inductor type sensor, and has a process at least once during the polishing, in which the flux penetrating at least a part of the conductive film increases according to the progress of the polishing, and from among the fluxes formed by the inductor, the change of the leakage flux penetrating the predetermined conductive film during the progress of the polishing is monitored as the change of the eddy current created by the leakage flux, and from the change of the eddy current when the film thickness during the polishing becomes a film thickness corresponding to the skin effect, a film thickness reference point is detected, and based on the film thickness reference point, the polishing rate and the remaining film thickness amount to be removed are calculated on the spot, and therefore, after the predetermined conductive film becomes a film thickness corresponding to the skin depth by the progress of the polishing, the leakage flux penetrating the predetermined conductive film is generated, and from the change of the eddy current accompanied with the change of the leakage flux, a film thickness reference point short of the endpoint of the polishing is detected. Consequently, based on the film thickness reference point, each polishing data such as the remaining film amount to be removed and the polishing rate can be precisely calculated on the spot, and the advantage is afforded that whether the predetermined conductive film is appropriately removed can be accurately evaluated.

The invention brings the inductor in the high frequency inductor type sensor close to the predetermined conductive film, and at least a part of the flux from among the fluxes formed by the inductor in the initial stage of the polishing allows a frequency to the extent of not penetrating the predetermined conductive film by the skin effect of the predetermined conductive film to be oscillated from the high frequency inductor type sensor, and has a process at least once during the polishing, in which the flux penetrating at least a part of the conductive film increases according to the progress of the polishing, and from among the fluxes formed by the inductor, the change of the eddy current generated by the change of the leakage flux penetrating the predetermined conductive film during the progress of the polishing is monitored as the change of the mutual inductance generated in the inductor by the eddy current, and from the change of the mutual inductance when the film thickness during the polishing becomes a film thickness corresponding to the skin effect, a film thickness reference point is detected, and based on the film thickness reference point, the polishing rate and the remaining film thickness amount to be removed are calculated on the spot, and therefore, after the predetermined conductive film becomes a film thickness corresponding to the skin depth by the progress of the polishing, the leakage flux penetrating the predetermined conductive film is generated, and from the change of the mutual inductance generated in the inductor by the change of the eddy current accompanied with the change of the leakage flux, a film thickness reference point short of the endpoint of the polishing is detected. Consequently, based on the film thickness reference point, each polishing data such as the remaining film amount to be removed and the polishing rate can be precisely calculated on the spot, and the advantage is afforded that whether the predetermined conductive film is appropriately removed can be accurately evaluated.

The invention brings the inductor in the high frequency inductor type sensor close to the predetermined conductive film, and at least a part of the flux from among the fluxes formed by the inductor in the initial stage of the polishing allows a frequency to the extent of not penetrating the predetermined conductive film by the skin effect of the predetermined conductive film to be oscillated from the high frequency inductor type sensor, and has a process at least once during the polishing, in which the flux penetrating at least a part of the conductive film increases according to the progress of the polishing, and from among the fluxes formed by the inductor, the change of the inductance of the sensor circuit system in the high frequency inductor type sensor based on the change of the leakage flux penetrating the predetermined conductive film during the progress of the polishing is monitored as the change of the resonance frequency decided by the inductance and the inherent capacity of the sensor circuit system, and from the change of the resonance frequency when the film thickness during the polishing becomes a film thickness corresponding to the skin effect, a film thickness reference point is detected, and based on the film thickness reference point, the polishing rate and the film thickness amount to be removed is calculated on the spot, and therefore, after the predetermined conductive film becomes a film thickness corresponding to the skin depth by the progress of the polishing, the leakage flux penetrating the predetermined conductive film is generated, and based on the change of the resonance frequency oscillated from the high frequency inductor type sensor by the change of the inductance of the sensor circuit system accompanied with the change of the leakage flux, a film thickness reference point short of the endpoint of the polishing is detected. Consequently, from the film thickness reference point, each polishing data such as the remaining film amount to be removed and the polishing rate can be precisely calculated on the spot, and the advantage is afforded that whether the predetermined conductive film is appropriately removed can be accurately evaluated.

The invention is such that each of the changes of the eddy current, the mutual inductance or the resonance frequency when the film thickness of the predetermined conductive film during the polishing becomes a film thickness equivalent to the skin depth or the vicinity has the maximum point (peak) generated by the actions of two phenomena of an increase of the eddy current by the increase of the leakage flux by the skin effect and a decrease of the eddy current accompanied with the decrease of the eddy current forming area, and based on this maximum point (peak), the film thickness reference point is detected, and therefore, in addition to the effect of the invention according to other embodiments, each of the changes of the eddy current, the mutual inductance or the resonance frequency after the predetermined conductive film becomes a film thickness corresponding to the skin depth by the progress of the polishing has a remarkable maximum point (peak) generated, and based on this remarkable maximum point (peak), a film thickness reference point can be precisely detected. Consequently, based on the film thickness reference point, each polishing data such as the remaining film amount to be removed and the polishing rate can be precisely calculated on the spot, and the advantage is afforded that whether the predetermined conductive film is appropriately removed can be accurately evaluated.

The invention is a polishing endpoint forecasting and detecting device which comprises a high frequency inductor type sensor including an oscillation circuit configuring a sensor circuit system comprised of a planar inductor and a capacitor, and forecasts and detects the polishing endpoint when a conductive film is polished and the predetermined conductive film is appropriately removed, and executes a method of forecasting and detecting the polishing endpoint according to other embodiments, and therefore, the polishing endpoint forecasting and detecting device which comprises a high frequency inductor type sensor including an oscillation circuit configuring a sensor circuit system comprised of a planer inductor and a capacitor generates a leakage flux penetrating the predetermined conductive film after the predetermined conductive film becomes a film thickness corresponding to the skin depth, and based on at least any of the change of the leakage flux, the change of the eddy current generated by the change of the leakage flux, the change of the mutual inductance generated in the planar inductor by the change of the eddy current or the change of the resonance frequency oscillated from the high frequency inductor type sensor by the change of the inductance of the sensor circuit system, a film thickness reference point short of the end point of the polishing is detected. Consequently, from the film thickness reference point, the endpoint of the polishing can be precisely forecast and detected, and at the same time, the advantage is afforded that the Joule heat loss due to the eddy current generated by the leakage flux can be suppressed to the minimum.

The invention is a real time film thickness monitor device which comprises a high frequency inductor type sensor including an oscillation circuit configuring a sensor circuit system comprised of a planar inductor and a capacitor and monitors a change of the film thickness during the polishing to evaluate whether the predetermined conductive film is appropriately removed, and executes a real time film thickness monitoring method according to other embodiments, and therefore, the real time film thickness monitor device which comprises a high frequency inductor type sensor comprising an oscillation circuit configuring a sensor circuit system comprised of a planar inductor and a capacitance generates a leakage flux penetrating the predetermined conductive film after the predetermined conductive film becomes a film thickness corresponding to the skin depth by the progress of the polishing, and from at least whichever change from among the change of the leakage flux, the change of the eddy current generated by the change of the leakage flux, the change of the mutual inductance generated in the planar inductor by the change of the eddy current or the change of the resonance frequency oscillated from the high frequency inductor type sensor by the change of the inductance of the sensor circuit system, a film thickness reference point short of the end point of the polishing is detected. Consequently, based on this film thickness reference point, each polishing data such as the remaining film amount to be removed and the polishing rate can be precisely calculated on the spot, and the advantage is afforded that whether the predetermined conductive film is appropriately removed can be evaluated and the Joule heat loss due to the eddy current generated by the leakage current can be suppressed to the minimum.

BRIEF DESCRIPTION OF THE DRAWINGS

FIG. 5 is a view showing a configuration example of polishing endpoint forecasting and detecting device according to the embodiment of the present invention.

FIG. 6 is a view showing a basic configuration example of an oscillation circuit in the polishing endpoint forecasting and detecting device of FIG. 5.

FIG. 7 is a view showing a result of an electromagnetic simulation to find to which direction a magnetic field generated from a coil is arrayed, and FIG. 7(a) shows the case where the oscillation frequency from a sensor is 1 MHz and a film thickness of the conductive film is 0.2 μm, and FIG. 7(b) show the case where the oscillation frequency from a sensor is 1 MHz and a film thickness of the conductive film is 1 μm, and FIG. 7(c) shows the case where the oscillation frequency from a sensor is 40 MHz and a film thickness of the conductive film is 0.2 μm, and FIG. 7(d) shows the case where the oscillation frequency from a sensor is 40 MHz and a film thickness of the conductive film is 1 μm;

FIG. 9 is an assembly drawing to explain a variation example of the flux and the like accompanied with polishing and removal of the conductive film by the chemical mechanical polishing device and detection operation of a film thickness reference point of FIG. 1, and FIG. 9(a) to 9(d) are views showing a variation example of the flux and the like accompanied with polishing and removal of the conductive film, and FIG. 9(e) is a characteristic view showing a variation example of the resonance frequency for a film thickness change of the conductive film;

FIG. 10 is an assembly drawing as a comparison example of FIG. 9, and FIG. 10(a) to 10(d) are views showing the flux accompanied with polishing and removal of the conductive film and a variation example of the eddy current, and FIG. 10(e) is a characteristic view showing a variation example of the resonance frequency for a film thickness change of the conductive film;

FIG. 11 is a view showing a result from the evaluation of a peak serving as a film thickness reference point with respect to a Cu film and a tungsten (W) film which are different in terms of the material and conductivity of the polishing object conductive film, FIG. 12 is a view showing a relationship between a film thickness and a resonance frequency in the case where the polishing object conductive film is a Cu film.

DETAILED DESCRIPTION OF THE PREFERRED EMBODIMENT

In order to achieve an object of suppressing a Joule heat loss due to an eddy current to the minimum and precisely forecasting and detecting the endpoint time of polishing, and further, precisely calculating a remaining film amount to be removed and a polishing rate or the like on the spot, thereby to accurately evaluate whether a predetermined conductive film is appropriately removed, a method of forecasting and detecting the polishing endpoint is provided to forecast and detect the polishing endpoint when a predetermined conductive film is appropriately removed by polishing a conductive film, and the method was realized by bringing an inductor in a high frequency inductor type sensor close to the predetermined conductive film, monitoring a flux change induced in the predetermined conductive film by the flux formed in the inductor, and based on the flux change by a skin effect in which a film thickness during the polishing is decided with the material of the predetermined conductive film as a factor, detecting a film thickness reference point, and forecasting the endpoint of time of the polishing from the film thickness reference point.

Figure 1:
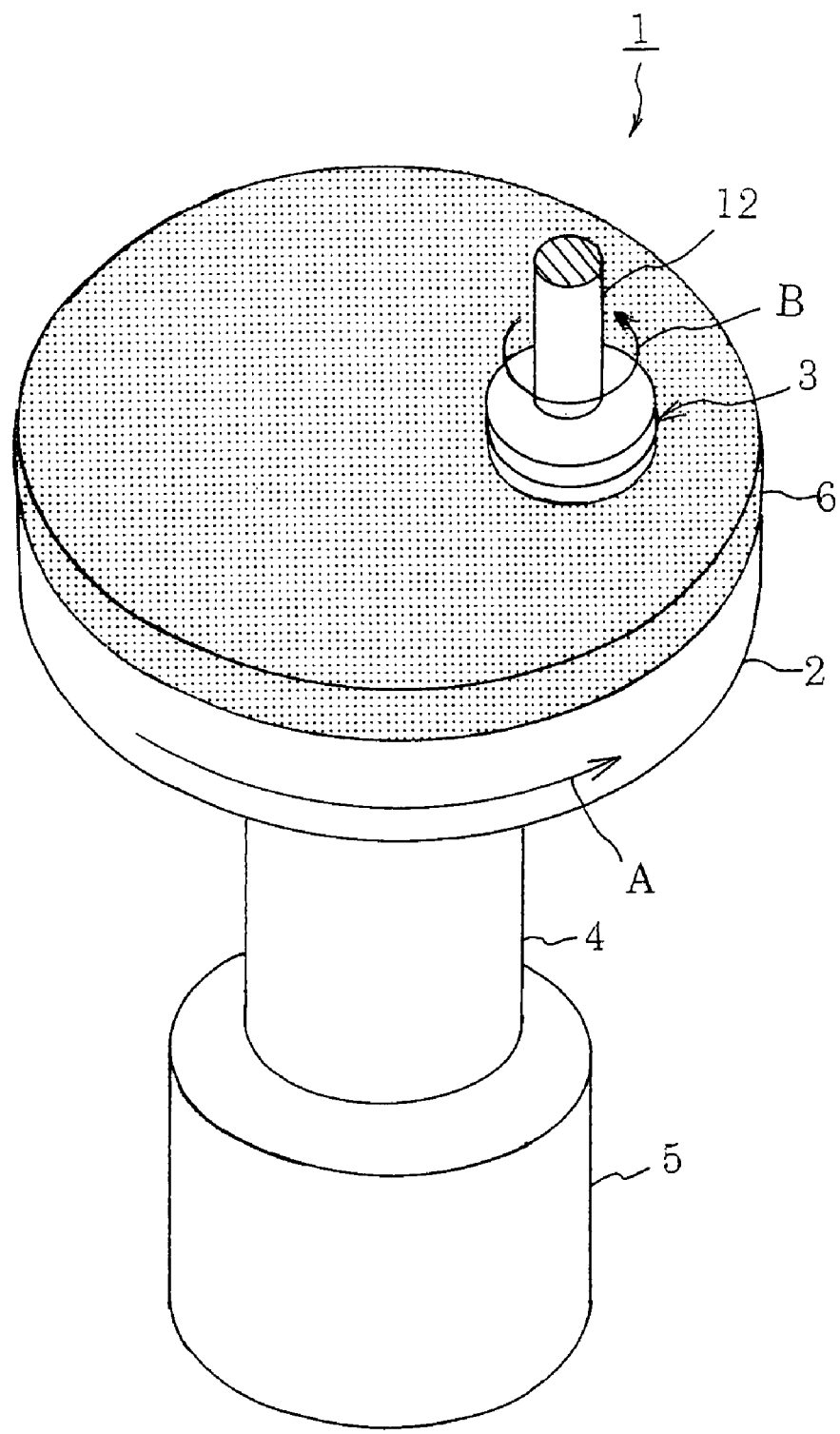
FIG. 1 is an perspective view of a chemical mechanical polishing device incorporated with a polishing endpoint forecasting and detecting device according to an embodiment of the present invention.
Figure 3:
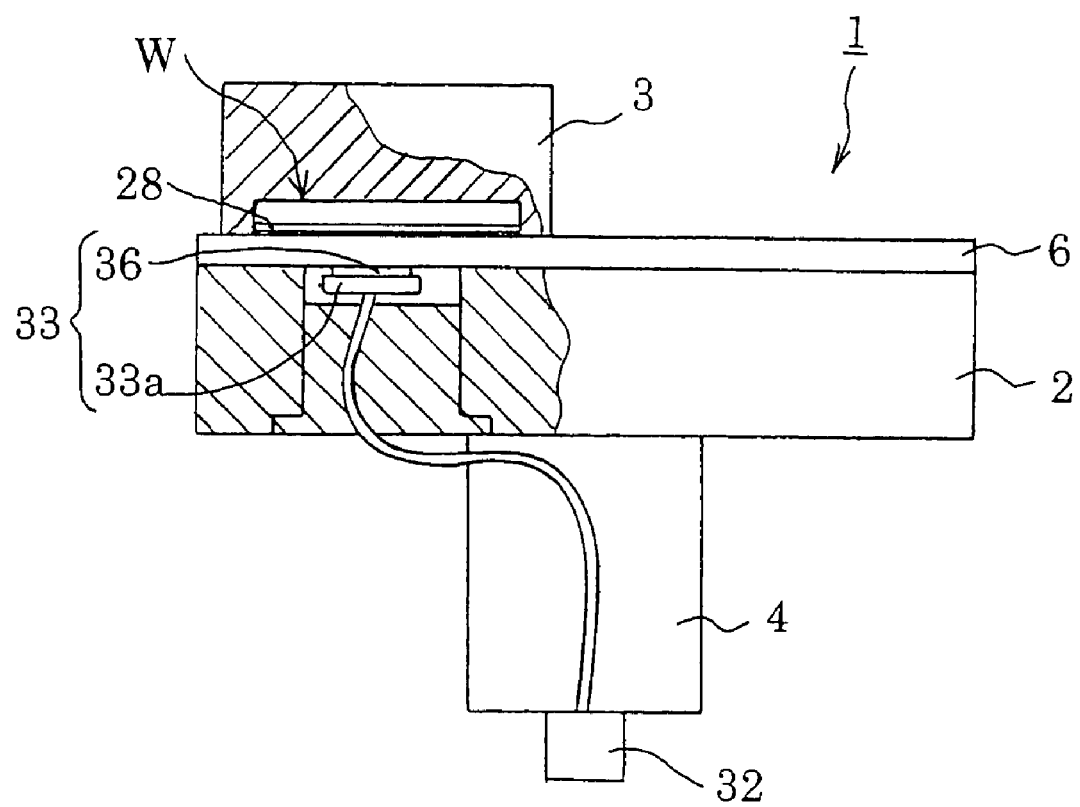
FIG. 3 is a schematic side view shown partially broken to explain a state in which the polishing endpoint forecasting and detecting device according to the embodiment of the present invention is incorporated into a platen.
Figure 4:
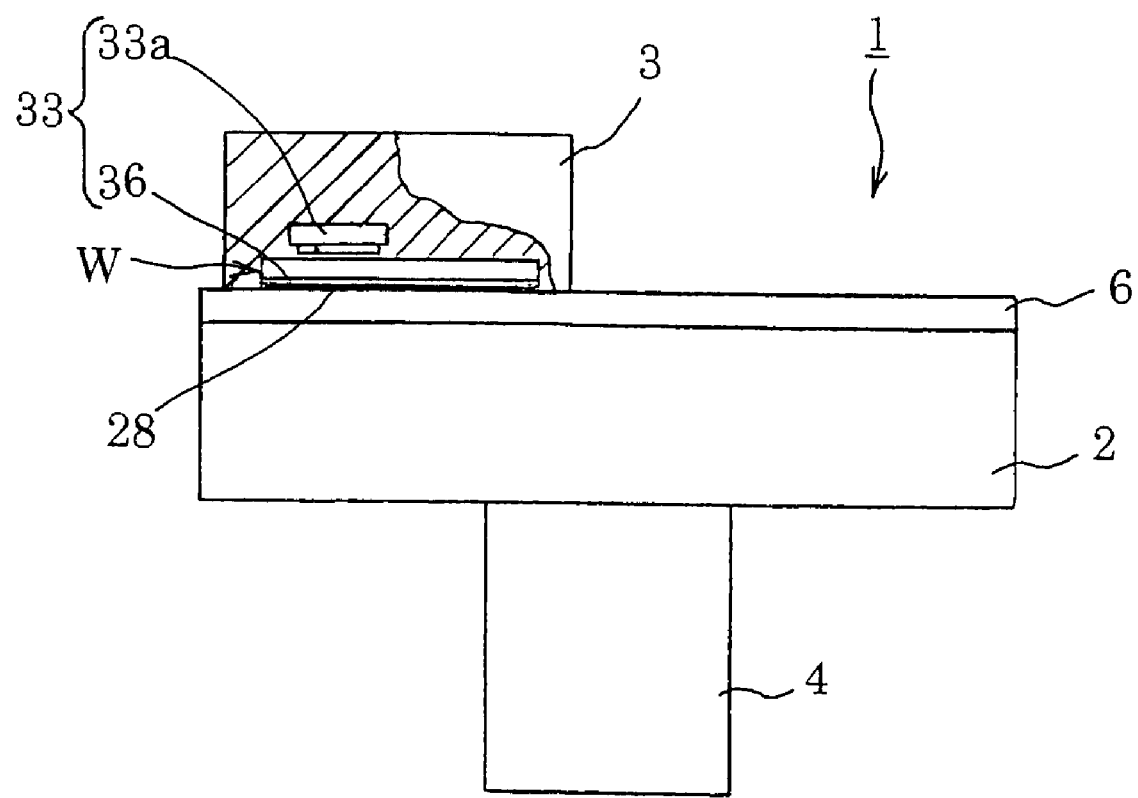
FIG. 4 is a schematic side view shown partially broken to explain a state in which the polishing endpoint forecasting and detecting device according to the embodiment of the present invention is incorporated into a polishing head.

Hereinafter, a method of forecasting and detecting the polishing endpoint and the configuration of the device thereof according to a first embodiment of the present invention will be described in detail according to the drawings. FIG. 1 is an perspective view of a chemical mechanical polishing device incorporated with a polishing endpoint forecasting and detecting device, FIG. 2 is an enlarged longitudinal cross-sectional view of a polishing head, FIG. 3 is a schematic side view shown partially broken to explain a state in which the polishing endpoint forecasting and detecting device is incorporated into a platen, FIG. 4 is a schematic side view shown partially broken to explain a state in which the polishing endpoint forecasting and detecting device is incorporated into the polishing head.

First, a method of forecasting and detecting the polishing endpoint and the device thereof according to the present embodiment will be described from the configuration of the chemical mechanical polishing device applied hereto. In FIG. 1, the chemical mechanical polishing device 1 is mainly comprised of a platen 2 and a polishing head 3. The platen 2 is formed in disk-shape, and a rotating shaft 4 is coupled to under surface center thereof, and by the driving of a motor 5, rotates in a direction to an arrow A. On the top surface of the platen 2, a polishing pad 6 is adhered, and above the polishing pad 6, slurry that is a mixture of abrasives and chemical agents is supplied from an unillustrated nozzle.

Figure 2:
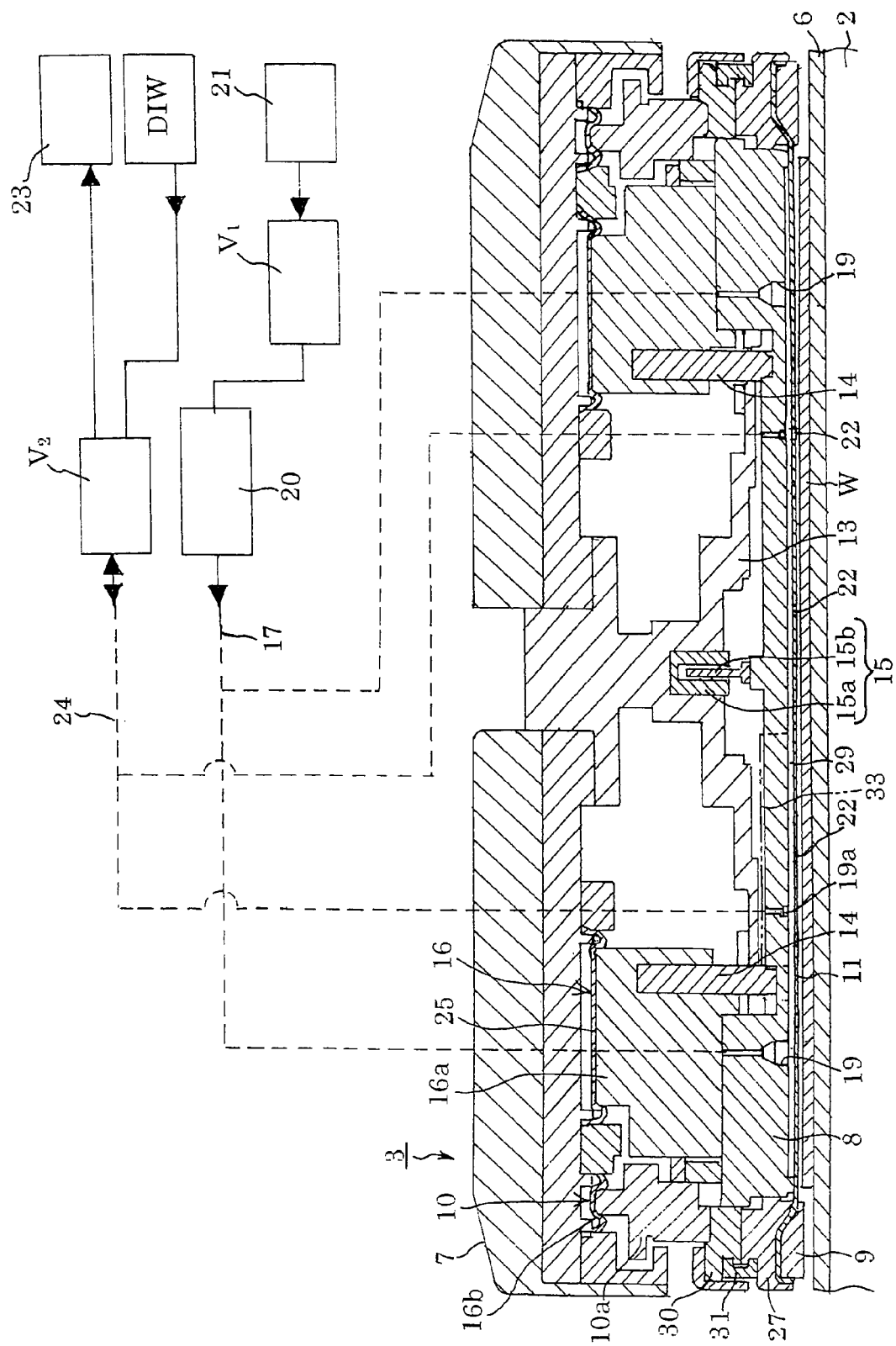
FIG. 2 is an enlarged cross-sectional view of a polishing head in the chemical mechanical polishing device of FIG. 1.

The polishing head 3, as shown in FIG. 2, is mainly comprised of a head main body 7, a carrier 8, a retainer ring 9, a retainer ring pressing means 10, an elastic sheet 11, a carrier pressing means 16, and a control means such as an air and the like.

The head main body 7 is formed in the disk-shape smaller than the platen 2, and on the center of the top surface, a rotating shaft 12 (see FIG. 1) is coupled. The head main body 7 is journaled to the rotating shaft 12, and is driven by an unillustrated motor, and is rotated in a direction to an arrow B of FIG. 1.

The carrier 8 is formed in the disk-shape, and is arranged in the center of the head main body 7. Between the center portion of the top surface of the carrier 8 and the center of the under surface of the main body 7, a dry plate 13 is provided, to which a rotation from the head main body 7 is transmitted through pins 14 and 14.

Between the center of the under surface of the dry plate 13 and the top portion of the center of the carrier 8, an operating transformer main body 15a is fixed, and moreover, on the top portion of the center of the carrier 8, a core 15b of the operating transformer 15 is fixed, and outputs a polishing state signal of the conductive film, which is coupled to an unillustrated control portion and is comprised of Cu and the like formed on a wafer W (lower surface side of FIG. 2), to the control portion.

The rim portion of the top surface of the carrier 8 is provided with carrier pressing members 16a, and the carrier 8 is transmitted with a pressing force from carrier pressing means 16 through the carrier pressing members 16a.

The lower surface of the carrier 8 is provided with an air outlet 19 to inject an air to the elastic sheet 11 from an air float line 17. The air float line 17 is connected to an air supply pump 21, which is an air supply source, through an air filter 20 and an automatic opening/closing valve V1. Blowing of an air from the air outlet 19 is executed by the switching of the automatic opening/closing valve V1.

The lower surface of the carrier 8 is formed with a vacuum or holes 22 to blow a DIW (deionized water) or an air as need arises. Suction of the air is executed by driving a vacuum pump 23, and an automatic opening/closing valve 2 is provided in a vacuum line 24, and by switching the automatic opening/closing valve 2, the feeding of the vacuum and the DIW is executed through the vacuum line 24.

The feeding of an air from the air float line 17, the vacuum operation from the vacuum line 24, and the feeding of the DIW and the like are executed by command signals from the control portion.

Incidentally, the carrier pressing means 16 is arranged on the rim of the center portion of the under surface of the head main body 7, and gives a pressing force to the carrier pressing member 16a, thereby transmitting the pressing force to the carrier 8 connected thereto. This carrier pressing means 16 preferably comprises an air bag 25 made of a rubber sheet which is expanded and contracted by air supply and exhaust. The air bag 25 is coupled with an unillustrated air supply mechanism to supply an air.

The retainer ring 9 is formed in the ring-shape, and is arranged on the outer periphery of the carrier 8. The retainer ring 9 is attached to a retainer ring holder 27 provided in the polishing head 3 and its inner periphery portion is stretched with the elastic sheet 11.

The elastic sheet 11 is formed in the circle-shape, and is bored with a plurality of holes 22. The elastic sheet 11 has the inner periphery portion sandwiched between the retainer ring 9 and a retainer ring holder 27, thereby to be stretched inside the retainer ring 9.

The bottom portion of the carrier 8 stretched with the elastic sheet 11 is formed with an air chamber 29 between the carrier 8 and the elastic sheet 11. The wafer W formed with the conductive film is pressed to the carrier 8 through the air chamber 29. The retainer ring holder 27 is attached to an attachment member 30 formed in the ring-shape through a snap ring 31. The attachment member 30 is coupled with a retainer ring pressing member 10a. The retainer ring 9 is transmitted with a pressing force from the retainer ring pressing means 10 through the retainer ring pressing member 10a.

The retainer pressing means 10 is arrange on the outer periphery portion of the lower surface of the head main body 7, and gives a pressing force to the retainer ring pressing member 10a, so that the retainer ring 9 coupled thereto is pressed to the polishing pad 6. The retainer ring pressing means 10 also preferably comprises, similarly to the carrier pressing means 16, an air bag 16a made of a rubber sheet. The air bag 16a is coupled with an unillustrated air supply mechanism to supply an air.

As shown in FIG. 3 or FIG. 4, the upper part portion of the platen 2 in the chemical mechanical polishing device 1 or the carrier 8 portion of the polishing head 3 is incorporated with one set each of the polishing endpoint forecasting and detecting device 33. When the polishing endpoint forecasting and detecting device 33 is incorporated into the platen 2 side, the detection signal such as a film thickness reference point from the polishing endpoint forecasting and detecting device 33 is outputted to the outside through a slip ring 32.

Incidentally, the polishing endpoint forecasting and detecting device 33 may be incorporated two sets each or more into the upper part portion of the platen 2 or the carrier 8 portion of the polishing head 3, respectively. With the polishing endpoint forecasting and detecting device 33 incorporated two sets or more, film thickness information is collected in time series from the polishing endpoint forecasting and detecting device 33 at the front side of the rotational direction, so that the distribution information and the like of the film thickness change of the conductive film 28 inside a wafer W surface can be obtained.

Figure 5A:
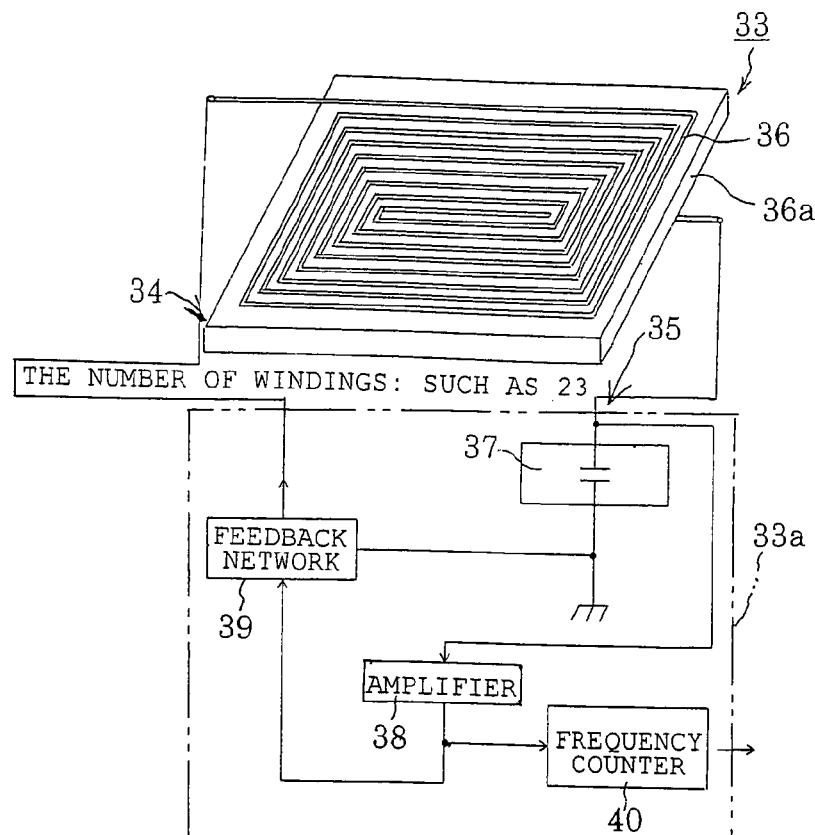
FIG. 5(a) is a block diagram.
Figure 5B:
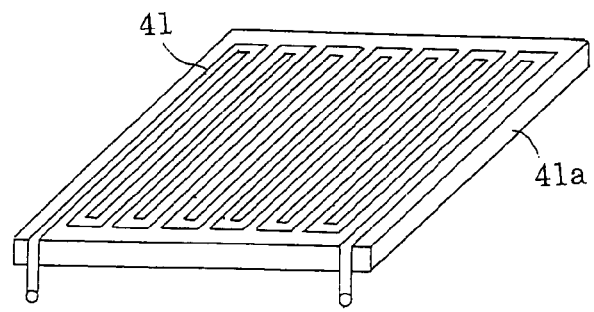
FIG. 5(b) is a view showing another configuration example of a planer inductor.
Figure 5C:
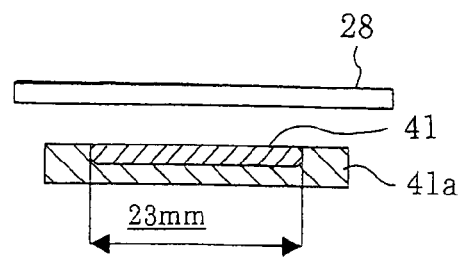
FIG. 5(c) is a cross-sectional view of the planer inductor of FIG. 5(b)

FIG. 5 is a view showing the configuration of the polishing endpoint forecasting and detecting device 33, and FIG. 5(a) is a block diagram, FIG. 5(b) is a view showing another block diagram of a planar inductor, and FIG. 5(c) is a cross-sectional view of the planer inductor of FIG. 5(b). The oscillation circuit 35 comprising a main body of the high frequency inductor type sensor 34 in the polishing endpoint forecasting and detecting device 33 connects a concentrated constant capacitor 37 which becomes a capacitance $C_0$ in series to a two-dimensional planer inductor 36 which becomes an inductance L, thereby to form a LC circuit. The planar inductor 36 is formed in a meander shape by using a conductive material such as Cu on a substrate 36a comprised of an insulating material in the shape of a square and the like.

The planar inductor 36, in addition to a spiral shape shown in FIG. 5(a), may be configured to be in a meander shape on a square substrate 41a similarly to the planar inductor 41 shown in FIG. 5(b). Further, it may be in the shape of an unillustrated round spiral. The two-dimensional planar inductors 36 and 41 are fabricated such that conductive films such as Cu are deposited on the substrates 36a and 41a comprised of the insulating material such as glass/epoxy, and paper/phenol, and after that, the films are subjected to etching and the like, so that they are fabricated with the line width extremely miniaturized, and the entire shape, as shown in FIG. 5(c), can be miniaturized into a squire shape to the extent of 23 mm in one side. Due to the miniaturization of the planer inductors 36 and 41, a microscopic magnetic field can be effectively generated, and without allowing the magnetic filed to infiltrate deep inside the conductive film 28, the changing behavior in the vicinity of the endpoint where the conductive film 28 is removed can be precisely detected.

The output signal from the LC circuit is inputted to an amplifier 38 comprising an operational amplifier and the like, and the output of the amplifier 38 is inputted to a feedback network 39 comprising a resistor and the like. The output signal of the feedback network 39 is positively fed back to the planar inductor 36, so that the oscillating circuit 35 is formed including the planer inductor 36.

Figure 6A:
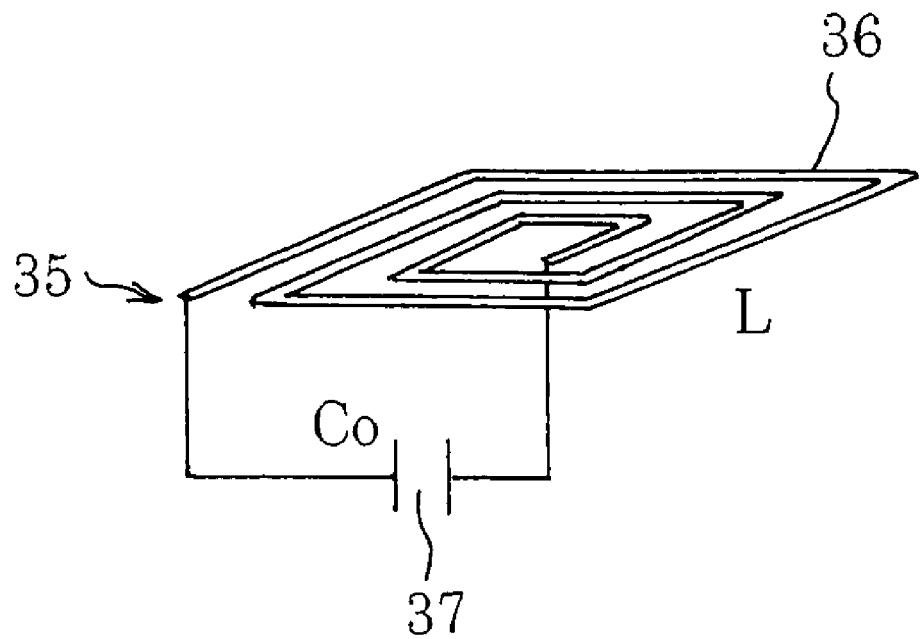
FIG. 6(a) is a block diagram.
Figure 6B:
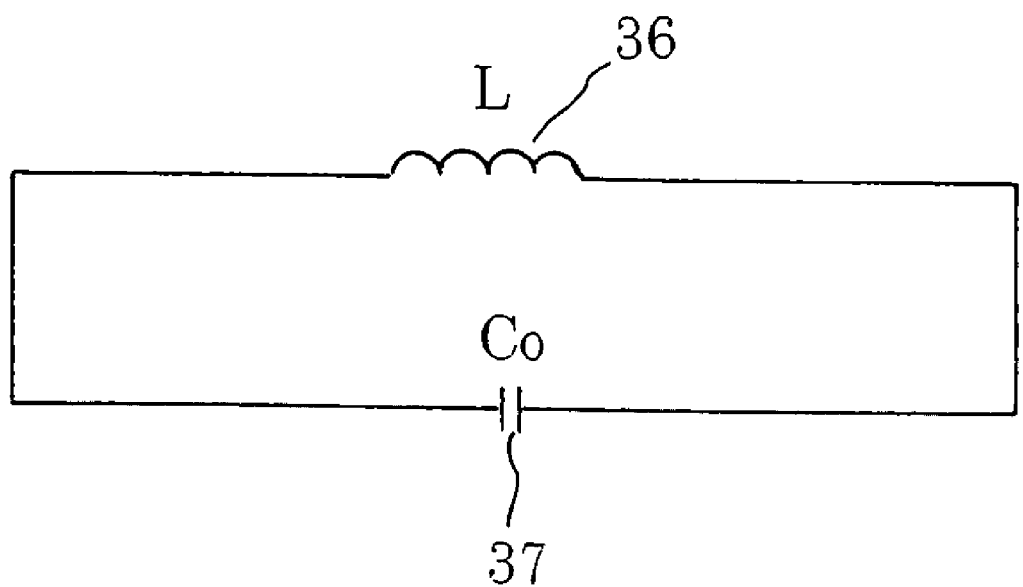
FIG. 6(b) is an equivalent circuit of FIG. 6(a)

The oscillating circuit 35, basically as shown in the block diagram of FIG. 6, is an oscillating circuit such as a Colpits type which is decided by an inductance L of the planar inductor 36 and a capacitance $C_0$ of the concentrated constant capacitor 37 with its oscillating frequency f as shown by the following expression (1).

$$f = \frac{1}{2\pi\sqrt{LC_0}} \quad (1)$$

The output terminal of the amplifier 38 is connected with a frequency counter 40. From the frequency counter 40, the detection signal and the like showing a film thickness reference point as hereinafter described is outputted in digital to the outside. By transmitting the detection signal in digital, the effect of a noise and an attenuation of the output can be prevented. Further, management easiness of the film thickness data can be obtained.

By including the high frequency inductor type sensor 34 and the frequency counter 40 including the planar inductor 36, the polishing endpoint forecasting and detecting device 33 is configured. The oscillation circuit 35 in the high frequency inductor type sensor 34 and the frequency counter 40 to monitor a change of the oscillation (resonance) frequency are adjacently arranged, so that a distributed constant circuit is formed in the wiring and wire connection portion between the oscillation circuit 35 and the frequency counter 40, thereby to prevent an inductance and a capacitance from becoming unnecessarily large, and a change of the flux accompanied with the progress of the polishing of the conductive film 28, which is brought to the vicinity of the high frequency inductor type sensor 34, can be precisely detected.

The polishing endpoint forecasting and detecting device 33 has component parts and circuits other than the planar inductor 36 put into an IC circuit and packaged in a package 33a. The planar inductor 36 is fixed on the surface of the package 33a coated with a thin insulating film. When the packaged polishing endpoint forecasting and detecting device 33 is incorporated into the chemical mechanical polishing device 1, as shown in FIGS. 3 and 4, the planar inductor 36 is incorporated so as to stand face to face the conductive film 28 of the wafer W surface.

Further, the concentrated constant capacitor 37 comprising the oscillation circuit 35 is variable in capacitance, and the high frequency inductor type sensor 34 can select an oscillation frequency in the range of the oscillation frequency band.

In the present embodiment, based on a change of the flux when the predetermined conductive film 28 during the polishing becomes a film thickness corresponding to a skin depth δ of the predetermined conductive film 28, the detection of a film thickness reference point as hereinafter described is performed. The skin depth δ of the predetermined conductive film 28 is decided as follows in the expression (2) by depending on the material of the predetermined conductive film 28 and an oscillation frequency f of the high frequency conductor type sensor 34.

$$\delta = \sqrt{\frac{2}{\omega\mu\sigma}} \quad (2)$$

where ω: 2πf, μ: permeability, and α: conductivity.

The oscillation frequency f of the high frequency inductor type sensor 34 is selected so that the skin depth δ is smaller than the initial film thickness of the predetermined conductive film 28 and larger than the film thickness of the predetermined conductive film 28 removing an embedded portion in the last stage of the polishing. When the material of the conductive film 28 of the polishing removal object is Cu, the oscillation frequency band selected is 20 MHz or more.

Here, the [film thickness corresponding to the skin depth] and the [flux change generated by the skin effect] will be described by using FIG. 7(a) to 7(d). FIG. 7 is a view showing a result of the electromagnetic simulation to find in which direction (arrow mark→downward in each Figure) the magnetic field generated from the coil is set in array. FIG. 7(a) is the case where the oscillation frequency from the sensor is 1 MHz, and the film thickness of the conductive film is 0.2 µm, FIG. 7(b) is the case where the oscillation frequency from the sensor is 1 MHz, and the film thickness of the conductive film is 1 µm, FIG. 7(c) is the case where the oscillation frequency from the sensor is 40 MHz, and the film thickness of the conductive film is 0.2 µm, and FIG. 7(d) is the case where the oscillation frequency from the sensor is 40 MHz, and the film thickness of the conductive film is 1 µm.

The setting of the electromagnetic simulation is such that the inductor forming the magnetic field is taken as a planar inductor having no directivity. The [film thickness corresponding to the skin depth] means the [film thickness in which the flux change is generated by the skin effect]. When the oscillation frequency of the sensor is 1 MHz, the flux on the conductive film existing at the bottom of the coil is directed in a longitudinal direction. In this frequency, even if the film thickness is 1 µm and 0.2 µm, the flux penetrates inside the conductive film (FIGS. 7(a) and 7(b)).

When the flux penetrates inside the conductive film in this manner, as shown in the conventional example, the eddy current generated inside the conductive film decreases accompanied with a decrease of the film thickness. Hence, in the case of 1 MHz, since the film thickness equal to 1 µm or less shows a monotonous behavior, the skin effect is not visible, and the [film thickness corresponding to the skin depth] is conceivable to be a film thickness thicker than at least 1 µm.

In contrast to this, when the oscillation frequency of the sensor is 40 MHz, the direction of the flux on the conductor surface is apparently horizontal, and when the film thickness is 1 µm, the flux hardly enters inside the conductor (FIG. 7(d)). When comparing with the previous case where the oscillation frequency is 1 MHz and the film thickness is 1 µm (FIG. 7(b)), it is apparent that the direction of the flux entering the conductive film is different.

However, when the oscillation frequency is 40 MHz and the conductive film becomes thin to 0.2 µm (FIG. 7(c)), a part of the flux alone is directed to the direction inside the conductive film. This shows that, even if the conductive film is Cu, when it becomes thin to some extent, a part of the flux penetrates inside the conductive film.

In the case of this flux of 40 MHz alternately changing, corresponding to the skin effect, a penetrating state of the flux inside the conductive film changes. Due to the effect of the penetrating flux gradually increasing, the frequency rapidly rises to the vicinity of 700 Å. Incidentally, when the film thickness is 1 µm or more, the flux hardly penetrates. Hence, in this case, when the [film thickness corresponding to the skin depth] is taken a film thickness of the boundary in which whether the flux penetrates or not, it may be to the extent of approximately 1 µm. Based on this fact, when the oscillation frequency is set high as 40 MHz and the planar inductor is used, the flux hardly enters inside the conductive film of Cu having a thickness of 1 µm, and this is due to the skin effect.

When the conductive film is Cu and the oscillation frequency is 40 MHz, assuming that the conductivity of Cu is taken as $58 \times 10^6$ S/m, a skin depth δ becomes 9.34 µm. Calculation-wise, when the film thickness is 1 µm, the flux enters sufficiently inside the conductive film. However, since the planar inductor is used and the flux has no directivity, in reality when the oscillation frequency is 40 MHz, even if the film thickness is 1 µm, the magnetic field does not intrude the conductive film due to the skin effect. As the conductive film becomes thinner, a part of the flux enters inside the conductive film, and the eddy current is slightly generated. As a result, it is not that the film thickness measurement is performed by positively using the eddy current, but when the film becomes thin in the vicinity of the endpoint, by using the flux slightly leaking and penetrating due to the skin effect and by using a flexion point (the maximum point) of the mutual inductance induced inside the conductive film, the film thickness state in the vicinity of the endpoint of the conductive film can be monitored.

Figure 8:
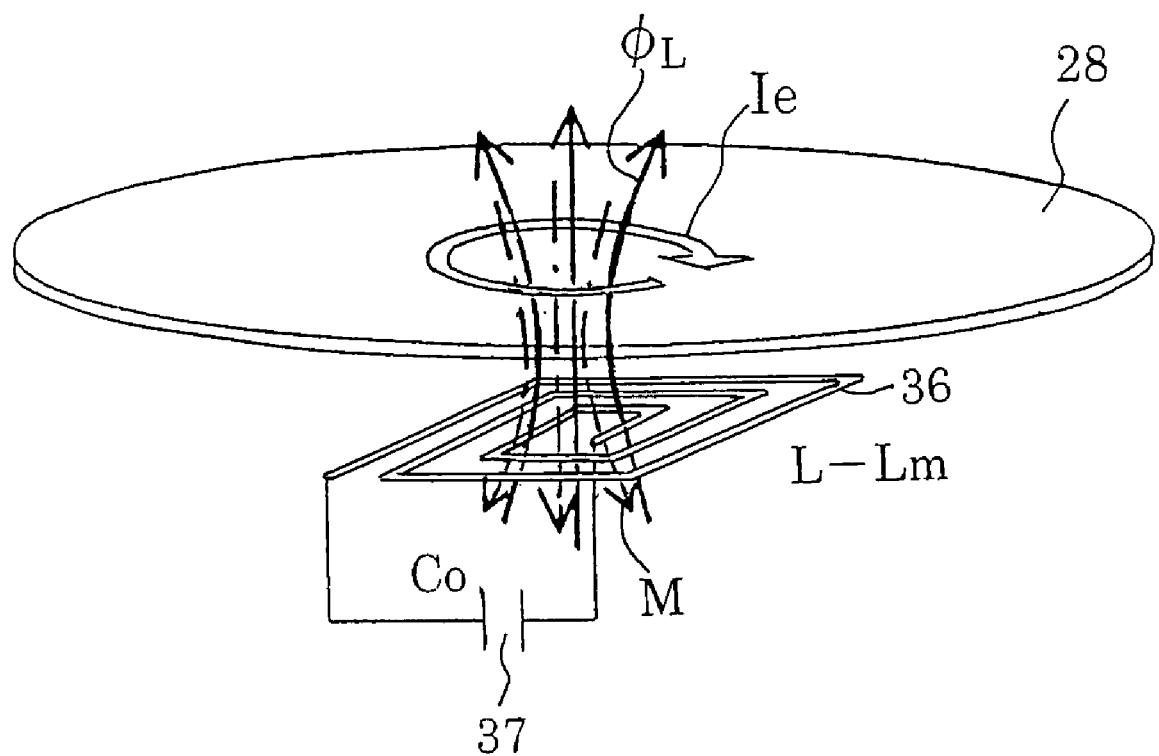
FIG. 8 is a block diagram to explain a variation action of the inductance by the magnetic filed generated by electromagnetic coupling in the high frequency inductor type sensor according to the embodiment of the present invention.

Next, the polishing operation of the chemical mechanical polishing device incorporated into the polishing endpoint forecasting and detecting device configured as describe above and the polishing endpoint forecasting and detection method will be described by using FIG. 8, FIG. 9(a) to 9(e) and FIG. 10(a) to 10(e) as comparison examples of FIG. 9. FIG. 8 is a view to explain a changing operation of the inductance due to the magnetic field generated by electromagnetic coupling in the high frequency inductor type sensor, FIG. 9 is an assembly drawing to explain variants of the flux and the eddy current accompanied with polishing and removal of the conductive film and a detection operation of the film thickness reference point, and FIG. 9(a) to 9(d) are view showing variants of the flux and the eddy current accompanied with polishing and removal of the conductive film, and FIG. 9(e) is a characteristic drawing showing a variant of the resonance frequency for the film thickness change of the conductive film. In FIG. 9(a) to 9(d), the planar inductor 36 is represented in a spiral shape to facilitate visualization of the drawing.

First, the polishing head 3 in the chemical mechanical polishing device 1 mounts the conductive film 3, which is waiting the conductive film 28 at a predetermined place, on the non-polished wafer W by an unillustrated migratory mechanism. The vacuum line 24 of the polishing head 3 is operated, and vacuumizes the air chamber 29 at the bottom of the elastic sheet 11 through a vacuum port 19a and the hole 22 (vacuum hole), and as a result, the conductive film 28 adsorbs and holds the non-polished wafer W, and by the migratory mechanism, the polishing head 3 in which the conductive film 28 adsorbs and holds the non-polished wafer W is transferred onto the platen 2, and the wafer W is mounted on the platen 2 in such a manner that the conductive film 28 stands face to face the polishing pad 6.

The vacuum line 24, when the polishing operation of the conductive film 28 on the top of the wafer W is terminated, adsorbs and holds the wafer W again by the polishing head 3 by the operation of the vacuum line 24, and can also transfer the wafer W to an unillustrated cleaning device.

Next, the operation of the vacuum line 24 is released, and an air is supplied to the air bag 25 from an unillustrated pump so as to inflate the airbag 25. At the same time, an air is supplied to the air chamber 29 from the air outlet 19 provided in the carrier 8. As a result, the inner pressure of the air chamber 29 is increased.

By the inflation of the air bag 25, the conductive film 28 and the retainer ring 9 on the top of the waver W are pressed to the polishing pad 6 by a predetermined pressure. In this state, the platen 2 is rotated in the direction to an arrow mark A in FIG. 1, and the polishing head 3 is rotated in the direction to an arrow mark B in FIG. 1, and on the rotating polishing pad 6, slurry is supplied from an unillustrated nozzle, thereby to polish the predetermined conductive film 28 on the top of the wafer W.

As hereinafter described, by the flux formed by the planar inductor 36 in the high frequency inductor type sensor 34, the film thickness change of the conductive film 28 accompanied with the polishing is monitored, and a film thickness reference point is detected.

The planar inductor 36 is driven by a high frequency oscillated from the oscillation circuit 35, and a flux φ changing with time corresponding to a cycle of the high frequency is generated from the planar inductor 36. The flux φ induced in the predetermined conductive film 28 in the initial stage of the polishing passes through the area only of the film thickness corresponding to the skin depth δ along the film surface approximately in parallel, and the intrusion of the flux φ into the area exceeding the film thickness corresponding to the skin depth δ in the predetermined conductive film 28 is avoided (FIG. 9(*a*)). Further, the resonance frequency oscillated from the high frequency inductor type sensor 34 is also held constant regardless of the film thickness change of the predetermined conductive film 28 (area a of FIG. 9(*e*)).

When the polishing progresses and the predetermined conductive film 28 becomes equivalent to the film thickness corresponding to the skin depth δ or the film thickness in its vicinity, a part of the flux φ penetrates the predetermined conductive film 28 so that a leakage flux $\phi_L$ begins to be generated. The flux φ not penetrating the predetermined conductive film 28 passes through as it is along the film surface approximately in parallel. In proportion to the number of the leakage fluxes $\phi_L$ having penetrated inside the predetermined conductive film 28, an eddy current Ie is generated (FIG. 9(*b*)).

When the polishing further progresses, the leakage flux $\phi_L$ increases, and the eddy current Ie is generated in a wide area along the film surface of the conductive film 28 (FIG. 9(*c*)).

The eddy current Ie generated in this wide area, as shown in FIG. 8, further creates a magnetic field M, and its magnetic field M operates so as to negate the flux $\phi_L$ generated from the original planar inductor 36. By the magnetic field M resultantly formed by the conductive film 28, the mutual inductance Lm rises, and an apparent inductance L of the original planar inductor 36 lowered. As a result, the oscillation frequency f oscillated from the high frequency inductor type sensor 34 increases as an express (3).

$$f = \frac{1}{2\pi\sqrt{(L-Lm)C_0}} \quad (3)$$

Consequently, by the generation of the mutual inductance, the inductance of the sensor circuit system decrease in an equivalent manner, and the resonance frequency oscillated from the high frequency inductor type sensor 34 rises (areas b and c of FIG. 9(*e*)).

Further, by the progress of the polishing, the leakage flux $\phi_L$ increases, and is saturated. However, the eddy current Ie rapidly decreases accompanied with the decrease of the film thickness volume of the predetermined conductive film 28 (FIG. 9(*d*)). By the rapid decrease of this eddy current flux $\phi_L$, the mutual conductance also rapidly decreases. This rapid decrease of the mutual inductance leads to the lowing of the decreased portion Lm of the inductance in the expression (3), and as a result, the inductance of the sensor circuit system increases in an equivalent manner, and the resonance frequency oscillated from the high frequency inductor type sensor 34 rapidly lowered (area d of FIG. 9(*e*)).

After the predetermined conductive film 28 becomes equivalent to a film thickness corresponding to the skin depth δ by the progress of the polishing or a film thickness in its vicinity in this manner, the eddy current Ie is generated, and due to the rapid decrease after that, the inductance of the sensor circuit system decreases once, and after that, turns to increase. By this behavior, a waveform of the resonance frequency oscillated from the high frequency inductor type sensor 34 is generated with a peak (flexion point). Based on this peak, a film thickness reference point P short of the polishing endpoint is detected, and the polishing endpoint is forecast from the film thickness reference point P. When the predetermined conductive film 28 is Cu, the remaining film amount at the time when the film thickness reference point P is detected is approximately 1000 Å, and a finish polishing and the like are performed for the remaining film amount, thereby terminate the polishing.

As far as the finish polishing is concerned, for example, the polishing is performed for the polishing time portion which sets in advance the film thickness corresponding to the skin depth, which is the remaining film amount in the film thickness reference point P, by the required polishing rate from the film thickness reference point P, and after that, the polishing is terminated. Alternatively, from the time required for the detection of the film thickness reference point P from the initial stage of the polishing and the polishing amount reaching the film thickness reference point P, the polishing rate during that period is calculated, and the film thickness corresponding to the skin depth which is the remaining film amount at the film thickness reference point P is divided by the polishing rate, so that the required polishing time after the detection of the film thickness reference point P is calculated. And after the detection of a film thickness reference point P, the polishing is terminated by polishing for the polishing time calculated.

Next, the comparison examples of FIG. 10(*a*) to 10(*e*) will be described. In these comparison examples, a frequency is applied so that the film thickness corresponding to the skin depth δ becomes larger then the initial film thickness of the conductive film 28. With such a frequency applied, during the monitoring of the film thickness change from the initial stage of the polishing to the final stage of the polishing, all the fluxes φ induced in the conductive film 28 penetrate the conductive film 28, so that the leakage flux$\phi_L$ is constantly generated. Consequently, during the monitoring of the film thickness change, the eddy currents Ie in proportion to the number of the leakage fluxes $\phi_L$ are generated (FIG. 10(*a*) to 10(*d*)). Hence, by these eddy currents Ie, a large mutual inductance is generated between the conductive film 28 and the planar inductor, and by the decreased portion Lm of the inductance by this mutual inductance, the oscillation frequency f oscillated from the sensor becomes as the expression (3) from the initial stage of the polishing.

As the film thickness decreases by the progress of the polishing, the eddy current Ie rapidly decreases (FIG. 10(*b*) to 10(*d*)), and accompanied with this decrease, the mutual inductance decreases, and the decreased portion Lm of the inductance in the expression (3) also decreases. As a result, the inductance of the sensor circuit system increases in an equivalent manner, and the resonance frequency oscillated from the senor monotonously decreases (FIG. 10(*e*)).

In this manner, in the comparison examples, since the resonance frequency draws a monotonous decrease curve, a film thickness decreased amount from the initial stage of the polishing can be evaluated, but the polishing endpoint or a state short of the polishing endpoint cannot be strictly discriminated. For example, when a floating capacity C changes due to a delicate setting, an overall resonance frequency of FIG. 10(*e*) shifts up and down across the entire waveform.

Hence, assuming that a setting is made such that a certain set frequency is set as a polishing endpoint, if the resonance frequency totally shifts, no threshold value can be set. Further, even if a state of the removed amount from the initial film thickness is monitored in real time by an eddy current change, when the initial film thickness fluctuates, the film thickness in a state of the polishing endpoint also fluctuates. Since there is no feature in the waveform, in this case also similarly to the above, no threshold value can be set.

Figure 11A:
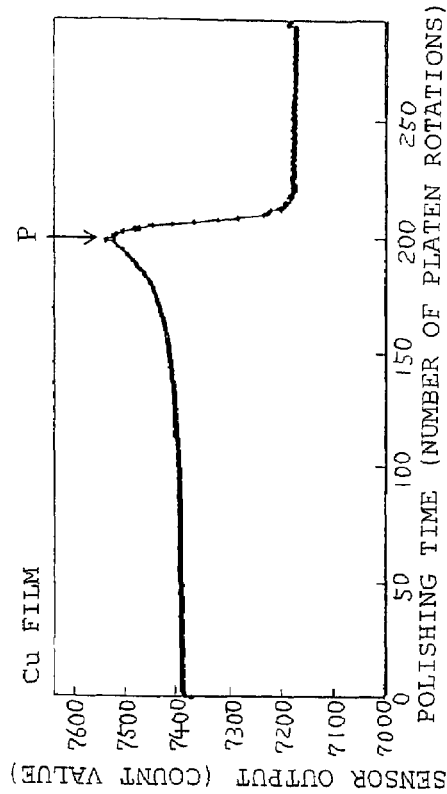
FIG. 11(a) is a view showing a wafer attached with a Cu film.
Figure 11B:
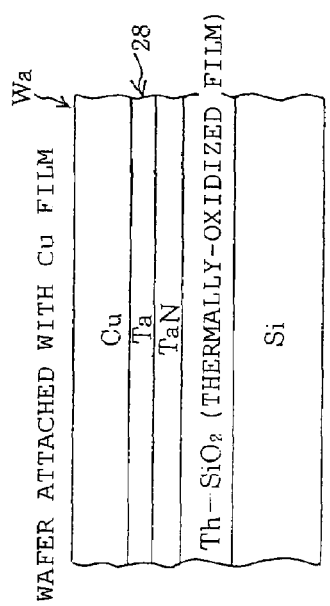
FIG. 11(b) is a view showing a variation characteristic example of the resonance frequency for a film thickness of the Cu film.
Figure 11C:
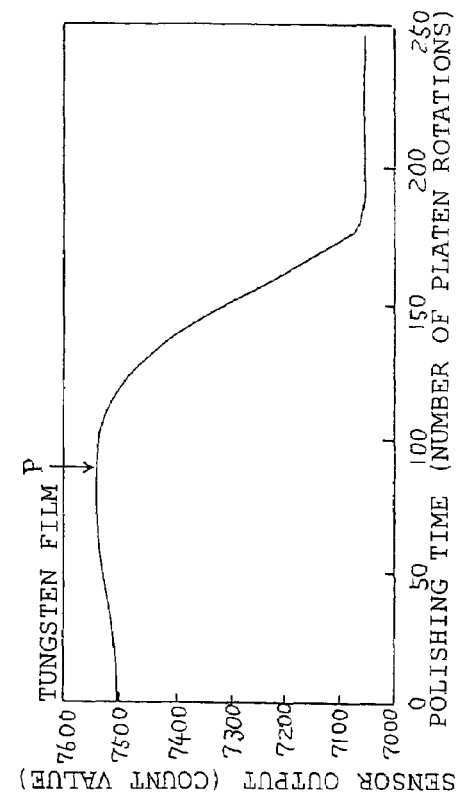
FIG. 11(c) is a view showing the wafer attached with a tungsten (W) film.
Figure 11D:
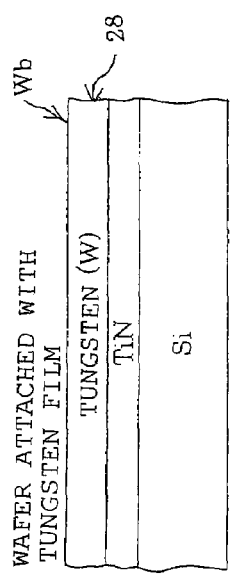
FIG. 11(d) is a view showing a variation characteristic example of the resonance frequency for a film thickness of the tungsten (W) film.

FIG. 11(a) to 11(d) show a result of the evaluation of the peak which becomes the film thickness reference point P regarding two types of wafers Wa and Wb different in terms of the material and conductivity of the conductive film as the polishing target. FIG. 10(a) is a wafer Wa attached with a Cu film, FIG. 10(b) is a variation feature of the resonance frequency for the film thickness of the Cu film, FIG. 11(c) is a wafer Wb attached with a tungsten (W) film, and FIG. 11(d) is a view showing a variation character of the resonance frequency for the film thickness of the tungsten (W) film, respectively. The sensor output of each longitudinal axis of FIGS. 11(b) and 11(c) corresponds to the resonance frequency.

Any of the Cu film and the tungsten (W) film has its resonance frequency once increased accompanied with the progress of the polishing, and after that, it rapidly decreases, and a peak (flexion point) is generated. Based on this peak (flexion point), each film thickness reference point P is detected. This behavior, comparing with the case of the tungsten (W) film shown in FIG. 11(d), is apparently remarkable in the Cu film large in conductivity shown in FIG. 11(b).

Figure 12A:
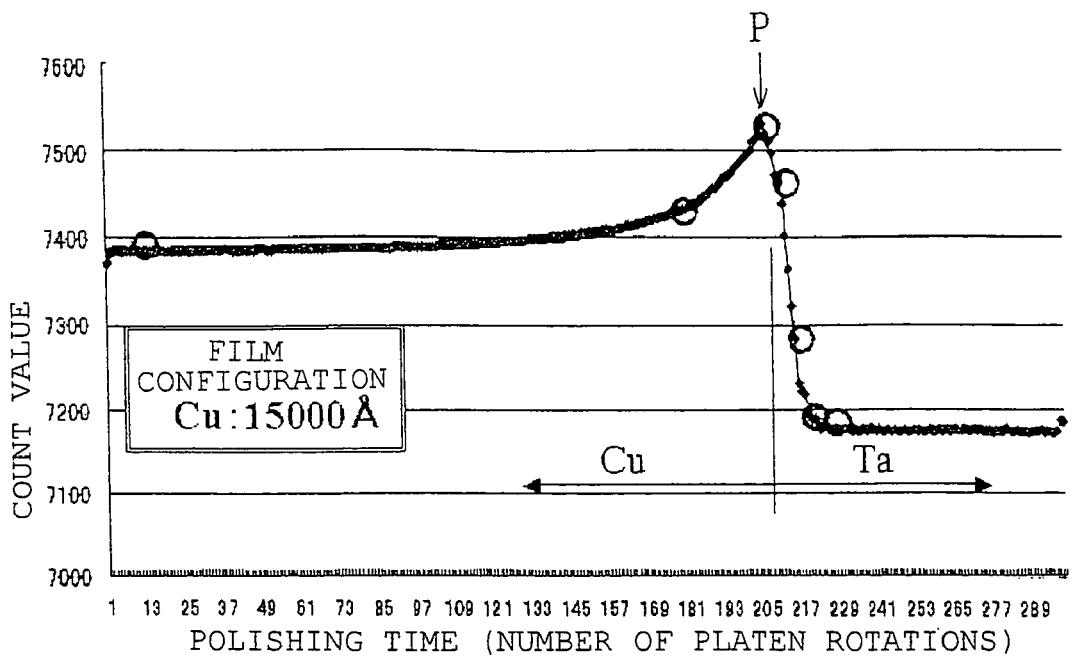
FIG. 12(a) is a view showing a relation example between a film thickness and a resonance frequency accompanied with the progress of the polishing.
Figure 12B:
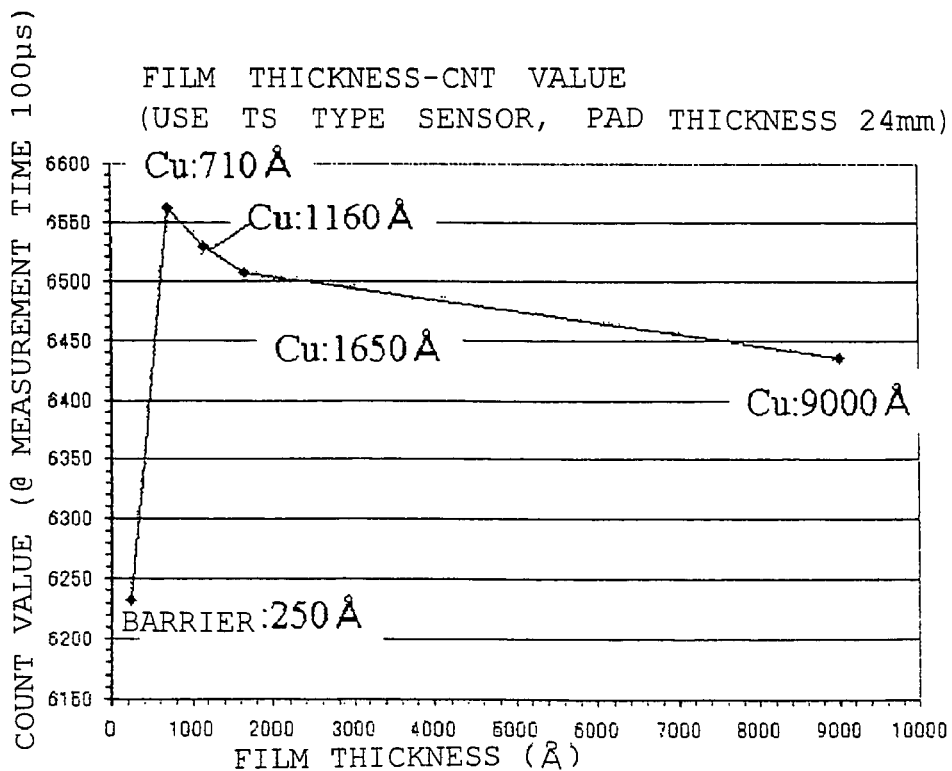
FIG. 12(b) is a view showing a relation example between a film thickness and a resonance frequency in a stationary state.

FIGS. 12(a) and 12(b) are views showing the relationship between the film thickness and the resonance frequency in the case where the conductive film of the polishing target is a Cu film. FIG. 12 (a) is a view showing the relationship between the film thickness and the resonance frequency accompanied with the progress of the polishing, and FIG. 12(b) is a view showing the relationship between the film thickness and the resonance frequency in resting state. The count value of each longitudinal axis of FIGS. 12(a) and 12(b) corresponds to the resonance frequency.

In FIG. 12(a), the initial film thickness of the Cu film is approximately 1.5 μm (15000 Å). The Cu film allows its resonance frequency to gradually rise in film thickness from the vicinity of approximately 1 μm (10000 Å) accompanied with the progress of the polishing, and takes the maximum value in the vicinity of 700 Å where the film thickness reference point P is detected. After taking the maximum value, the resonance frequency rapidly lowered. In this manner, the Cu film has the remaining film thickness precisely detected when the film thickness reference point P is detected.

In FIG. 12(b), the resonance frequency measured for each film thickness of the Cu film in resting state shows the maximum value at 710 Å in film thickness. Consequently, the film thickness of the Cu film in which the resonance frequency becomes the maximum in resting state and the film thickness of the Cu film in which the resonance frequency becomes the maximum during the progress of the polishing are approximately in consistent with each other.

Incidentally, the present embodiment is capable of detecting the film thickness reference point P based on at least any change of the changes of the mutual inductance, the eddy current Ie, and the leakage flux$\phi_L$. The change of the mutual inductance can be determined from the change of the oscillation frequency of the high frequency inductor type sensor 34 by using the expression (3), and as the eddy current Ie is in a proportional relation with the mutual inductance, the change of the eddy current Ie can be determined by using the change of the mutual inductance, and as the leakage flux$\phi_L$ is in a proportional relation with the eddy current Ie, the change of the leakage flux$\phi_L$ can be determined by using the change of the eddy current Ie.

As described above, in the polishing endpoint forecasting and detecting method and its device according to the present embodiment, after the predetermined conductive film 28 becomes equivalent to the skin depth or the film thickness short of the polishing endpoint in its vicinity, the leakage flux$\phi_L$ which becomes the base of the detection of the film thickness reference point P is generated, so that the Joule heat loss due to the eddy current Ie generated by the leakage flux$\phi_L$ can be suppressed to the minimum.

In each change of the eddy current Ie, the mutual inductance or the resonance frequency after the predetermined conductive film 28 becomes equivalent to a film thickness corresponding to the skin depth δ or a film thickness in its vicinity due to the progress of the polishing, a remarkable peak is generated, and therefore, based on this remarkable peak, the film thickness reference point P short of the polishing endpoint can be accurately detected. Consequently, from the film thickness reference point P, the polishing endpoint can be precisely forecast and detected.

The transmission method of the resonance frequency from the high frequency inductor type sensor 34 is taken as a digital output by using the frequency counter 40, and therefore, the effect of the noise and the attenuation of the resonance frequency output can be prevented so that the film thickness reference point P can be certainly detected.

The concentrated constant capacitor 37 comprising the high frequency inductor type sensor 34 is made capacitance variable, and therefore, the oscillation frequency can be easily selected so that the film thickness corresponding to the skin depth δ becomes an appropriate value for the conductive films 28 of different types of films.

The planar inductor 36 which is a main component of the high frequency inductor type sensor 34 has almost no generation of the noise nor the power consumption, and further it is relatively moderate in price, so that the reduction in cost can be realized.

Hereinafter, a real time film thickness monitoring method and its device according to a second embodiment of the present invention will be described. The polishing endpoint forecasting and detecting device 33 shown in FIGS. 5(a), 5(b), and 5(c) function as the real time film thickness monitor device. The real time film thickness monitor device 33, as shown in FIGS. 3 and 4, is incorporated into the platen 2 or the polishing head 3.

The real time film thickness monitoring method by the real time film thickness monitor device 33 will be described. The film thickness reference point P short of the polishing endpoint shown in FIG. 9(e) is detected by the method similar to the first embodiment. The film thickness reference point P output from the frequency counter 40 is inputted to an unillustrated CPU and the like, based on the film thickness reference point P, each polishing data such as the remaining film amount to be removed which is approximately equivalent to the film thickness corresponding to the skin depth δ, the film thickness amount already polished and removed and the time required thereof are calculated on the spot, and whether the predetermined conductive film 28 is appropriately removed is evaluated in real time.

As described above, in the real time film thickness monitoring method and its device according to the present embodiment, after the detection of the film thickness reference point P short of the polishing endpoint, based on the film thickness reference point P, each polishing data such as the remaining

What is claimed is:

1. A polishing endpoint forecasting and detecting method to forecast and detect a polishing endpoint when a conductive film is polished and a predetermined conductive film is appropriately removed,
wherein the inductor in the high frequency inductor type sensor is brought close to the predetermined conductive film, and at least a part of the flux from among the fluxes formed by the inductor in the initial stage of the polishing allows an inductor shape generating the magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating the predetermined conductive film increases according to the progress of the polishing, and from among the fluxes formed by the inductor, the change of the leakage flux penetrating the predetermined conductive film during the progress of the polishing is monitored as the change of the eddy current created by the leakage flux, and based on the change of the eddy current when the film thickness during the polishing becomes equivalent to the skin depth accompanied with the skin effect or its vicinity, a film thickness reference point is detected, and from the film thickness reference point, a method of forecasting and detecting the polishing endpoint to forecast the polishing endpoint is provided.

2. The polishing endpoint forecasting and detecting method according to claim 1, wherein, regarding the method of forecasting the polishing endpoint from the film thickness reference point, the polishing endpoint is terminated after having polished for the polishing time set in advance from the film thickness reference point.

3. The polishing endpoint forecasting and detecting method according to claim 1,
wherein regarding the method of forecasting the polishing endpoint from the film thickness reference point, from the time having reached the film thickness reference point from the initial stage of the polishing and a polishing amount up to the film thickness reference point, the polishing rate for that much portion is calculated, and the film thickness of said film thickness reference point is divided by the polishing rate, thereby to calculate the remaining polishing time required from said film thickness reference point to the polishing endpoint, and the polishing is made for the time calculated from said film thickness reference point, and after that, the polishing is terminated.

4. A polishing endpoint forecasting and detecting method to forecast and detect a polishing endpoint when the predetermined conductive film is appropriately removed polishing a conductive film,
wherein the inductor in the high frequency inductor type sensor is brought close to the predetermined conductive film, and at least a part of the flux from among the fluxes formed by the inductor in the initial stage of the polishing allows an inductor shape generating the magnetic field having no directivity to the extent of not penetrating the predetermined conductive film by the skin effect of the predetermined conductive film and a frequency to the extent of not penetrating the conductive film by the skin effect to oscillate from the high frequency inductor type sensor, and has a process at least once, in which the flux penetrating at least a part of the predetermined conductive film increases according to the progress of the polishing, and from among the fluxes formed by the inductor, the change of the eddy current generated by the change of the leakage flux penetrating the predetermined conductive film during the progress of the polishing is monitored as the change of the mutual inductance generated in the inductor by the eddy current, and based on the change of the mutual inductance when the film thickness during the polishing becomes equivalent to the skin depth accompanied with the skin effect or its vicinity, a film thickness reference point is detected, and the method of forecasting and detecting the polishing endpoint to forecast an endpoint of the polishing from the film thickness reference point is provided.

5. A polishing endpoint forecasting and detecting method to forecast and detect a polishing endpoint when a conductive film is polished and a predetermined conductive film is appropriately removed,
wherein the inductor in the high frequency inductor type sensor is brought close to the predetermined conductive film, and at least a part of the flux from among the fluxes formed by the inductor in the initial stage of the polishing allows the inductor shape generating the magnetic field having no directivity to the extent of not penetrating the predetermined conductive film by the skin effect of the predetermined conductive film and the frequency to the extent of not penetrating the predetermined conductive film by the skin effect to oscillate from the high frequency inductor type sensor, and has a process at least once, in which the flux penetrating at least a part of the conductive film increases according to the progress of the polishing, and from among the fluxes formed by the inductor, the change of the inductance of the sensor circuit system in the high frequency inductor type sensor based on the change of the leakage flux penetrating the predetermined conductive film during the progress of the polishing is monitored as the change of the resonance frequency decided by the inductance and an inherent capacity of the sensor circuit system, and based on the change of the resonance frequency when the film thickness during the polishing becomes a film thickness corresponding to the skin effect, a film thickness reference point is detected, and the method of forecasting and detecting the polishing endpoint to forecast the polishing endpoint from this film thickness reference point is provided.

6. A polishing endpoint forecasting and detecting method to forecast and detect a polishing endpoint when a conductive film is polished and a predetermined conductive film is appropriately removed,
wherein the inductor in the high frequency inductor type sensor is brought close to the predetermined conductive film, and at least a part of the fluxes formed by the inductor in the initial stage of the polishing allows an inductor shape generating the magnetic field having no directivity to the extent of not penetrating the predetermined conductive film by the skin effect of the predetermined conductive film and the frequency to the extent of not penetrating the predetermined conductive film by the skin effect to oscillate from the high frequency inductor type sensor, and has a process at least once, in which the flux penetrating at least a part of the conductive film increases according to the progress of the polishing, and from among the fluxes formed by the inductor, at least whichever change of the eddy current generated by the change of the leakage flux penetrating the predetermined conductive film during the progress of the polishing, the change of the mutual inductance generated in the inductor by the change of the eddy current or the change of the resonance frequency oscillated from the high frequency inductor type sensor by the change of the inductance of the sensor circuit system in the high frequency inductor type sensor based on the change of the mutual inductance is monitored, and based on at least whichever change from among each of the changes when the film thickness during the polishing becomes a film thickness corresponding to the skin effect, a film thickness reference point is detected, and from the film thickness reference point, the method of forecasting and detecting the polishing endpoint to forecast the polishing endpoint is provided.

7. The polishing endpoint forecasting and detecting method according to claim 6, wherein during each of the changes of the eddy current, the mutual inductance or the resonance frequency when the film thickness of the predetermined conductive film during the polishing becomes a film thickness corresponding to the skin depth, the maximum point (peak) is generated by the actions of two phenomena of the increase of the eddy current by the increase of the leakage flux generated in the film thickness corresponding to the skin depth and the decrease of the eddy current forming area, and based on this maximum point (peak), the film thickness reference point is detected.

8. A real time film thickness monitoring method monitoring the film thickness change during the progress of the polishing to evaluate whether the conductive film is polished and the predetermined conductive film is appropriately removed, wherein the inductor in the high frequency inductor type sensor is brought close to the predetermined conductive film, and at least a part of the flux from among the fluxes formed by the inductor in the initial stage of the polishing allows the frequency to the extent of not penetrating the predetermined conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the leakage flux penetrating the predetermined conductive film during the progress of the polishing is monitored, and from the change of the leakage flux when the film thickness during the polishing becomes a film thickness corresponding to the skin effect, a film thickness reference point is detected, and a real time film thickness monitoring method which calculates on the spot the polishing rate and a remaining film thickness amount to be removed based on a film thickness reference point is provided.

9. A real time film thickness monitoring method monitoring the film thickness change during the progress of the polishing to evaluate whether the conductive film is polished and the predetermined conductive film is appropriately removed, wherein the inductor in the high frequency inductor type sensor is brought close to the predetermined conductive film, and at least a part of the flux from among the fluxes formed by the inductor in the initial stage of the polishing allows the frequency to the extent of not penetrating the conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the leakage flux penetrating the predetermined conductive film during the progress of the polishing is monitored as the change of the eddy current created by the leakage flux, and from the change of the leakage flux when the film thickness during the polishing becomes a film thickness corresponding to the skin effect, a film thickness reference point is detected, and a real time film thickness monitoring method of calculating on the spot a polishing rate and the remaining film thickness amount to be removed based on a film thickness reference point is provided.

10. A real time film thickness monitoring method monitoring the film thickness change during the progress of the polishing to evaluate whether the predetermined conductive film is appropriately removed by polishing the conductive film, wherein the inductor in the high frequency inductor type sensor is brought close to the predetermined conductive film, and at least a part of the flux from among the fluxes formed by the inductor in the initial stage of the polishing allows the frequency to the extent of not penetrating the conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the eddy current generated by the change of the leakage flux penetrating the predetermined conductive film during the progress of the polishing is monitored as the change of the mutual inductance generated in the inductor by the eddy current, and from the change of the leakage flux when the film thickness during the polishing becomes a film thickness corresponding to the skin effect, a film thickness reference point is detected, and a real time film thickness monitoring method of calculating on the spot the polishing rate and a remaining film thickness amount to be removed based on a film thickness reference point is provided.

11. A real time film thickness monitoring method monitoring the film thickness change during the progress of the polishing to evaluate whether the predetermined conductive film is appropriately removed by polishing the conductive film, wherein the inductor in the high frequency inductor type sensor is brought close to the predetermined conductive film, and at least a part of the flux from among the fluxes formed by the inductor in the initial stage of the polishing allows the frequency to the extent of not penetrating the predetermined conductive film by the skin effect of the predetermined conductive film to oscillate from the high frequency inductor type sensor, and has a process once at least, in which the flux penetrating at least a part of the conductive film increases according to the progress of the polishing, and from among the fluxes formed by the inductor, the change of the inductance of the sensor circuit system in the high frequency inductor type sensor based on the change of the leakage flux penetrating the predetermined conductive film during the progress of the polishing is monitored as the change of the resonance frequency decided by the inductance and the inherent capacity of the sensor circuit system, and from the change of the resonance frequency when the film thickness during the polishing becomes a film thickness corresponding to the skin effect, a film thickness reference point is detected, and based on this film thickness reference point, the real time film thickness monitoring method of calculating on the spot the polishing rate and the film thickness amount to be removed is provided.

12. The real time film thickness monitoring method according to claims 9, 10 or 11, wherein, during each change of the eddy current, the mutual inductance or the resonance frequency when the film thickness of the predetermined conductive film during the polishing becomes a film thickness equivalent to the skin depth or its vicinity, a peak is generated by the actions of two phenomena of an increase of the eddy current by the increase of the leakage flux by the skin effect and a decrease of the eddy current accompanied with the decrease of the film thickness volume by the polishing, and based on this peak, a film thickness reference point is detected.

* * * * *